(12) United States Patent
Tanaka

(10) Patent No.: US 7,696,653 B2
(45) Date of Patent: Apr. 13, 2010

(54) MOVABLE-BODY APPARATUS, EXPOSURE APPARATUS AND METHODS COMPRISING SAME, AND DEVICE-MANUFACTURING METHODS

(75) Inventor: Keiichi Tanaka, Saitama (JP)

(73) Assignee: Nikon Corporation, Tokyo (JP)

( * ) Notice: Subject to any disclaimer, the term of this patent is extended or adjusted under 35 U.S.C. 154(b) by 71 days.

(21) Appl. No.: 11/712,243

(22) Filed: Feb. 27, 2007

(65) Prior Publication Data

US 2007/0273860 A1 Nov. 29, 2007

(30) Foreign Application Priority Data

Mar. 30, 2006 (JP) .............................. 2006-095982

(51) Int. Cl.
*H02K 41/02* (2006.01)

(52) U.S. Cl. .................................. 310/12.01

(58) Field of Classification Search ............. 310/12, 310/12.01; 355/52, 72; 318/135
See application file for complete search history.

(56) References Cited

U.S. PATENT DOCUMENTS

| | | | |
|---|---|---|---|
| 5,448,332 A | 9/1995 | Sakakibara et al. | |
| 5,610,715 A | 3/1997 | Yoshii et al. | |
| 6,339,266 B1* | 1/2002 | Tanaka ........................ | 310/12 |
| 6,594,334 B1* | 7/2003 | Ota ............................. | 378/34 |
| 6,674,085 B2 | 1/2004 | Miura et al. | |
| 6,690,455 B2* | 2/2004 | Fujinaka ..................... | 356/121 |
| 6,693,284 B2 | 2/2004 | Tanaka | |
| 6,778,257 B2 | 8/2004 | Bleeker et al. | |
| 6,816,232 B2* | 11/2004 | Takahashi et al. ............. | 355/53 |
| 2002/0180312 A1* | 12/2002 | Tanaka ........................ | 310/328 |
| 2003/0035088 A1 | 2/2003 | Emoto | |
| 2003/0098962 A1 | 5/2003 | Kubo | |
| 2005/0093378 A1 | 5/2005 | Ohishi | |
| 2005/0212361 A1 | 9/2005 | Emoto | |

FOREIGN PATENT DOCUMENTS

| | | |
|---|---|---|
| EP | 1 262 835 A2 | 12/2002 |
| JP | SHO 58-115945 | 7/1983 |
| JP | HEI 05-59660 | 8/1993 |
| JP | 61-44429 | 5/1994 |
| JP | 06-283403 | 10/1994 |
| JP | 07-288276 | 10/1995 |
| JP | 10-177942 | 6/1998 |
| JP | 2001-148339 | 5/2001 |
| JP | 2001-168008 | 6/2001 |
| JP | 2001-257252 | 9/2001 |
| JP | 2001-319865 | 11/2001 |
| JP | 2002-353118 | 12/2002 |
| JP | 2003-229347 | 8/2003 |
| WO | WO 01/27978 A1 | 4/2001 |
| WO | WO 2004/053955 A1 | 6/2004 |
| WO | WO 2005/074014 A1 | 8/2005 |

* cited by examiner

*Primary Examiner*—Javaid Nasri
(74) *Attorney, Agent, or Firm*—Klarquist Sparkman, LLP

(57) ABSTRACT

Movable-body apparatus, notably configured as stages, are disclosed that include at least one movable body and at least one respective actuator. The actuator drives the movable body in the direction of at least one axis in a predetermined plane. A waste-heat member is situated in a non-contacting manner with the movable body. The waste-heat member absorbs heat radiated from the movable body. Thus, adverse thermal influences of the movable body are suppressed without a need to connect a coolant conduit to the movable body, which eliminates decreases in movement accuracy conventionally caused by tension of such a conduit on the movable body.

56 Claims, 12 Drawing Sheets

FIG. 3A
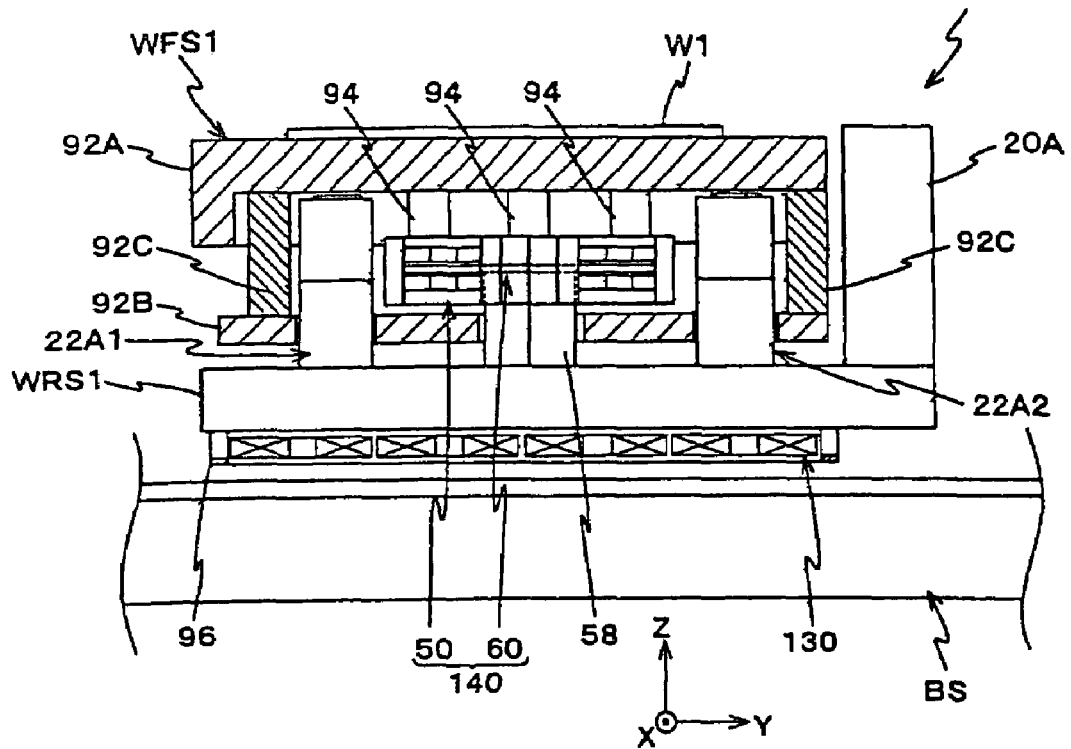
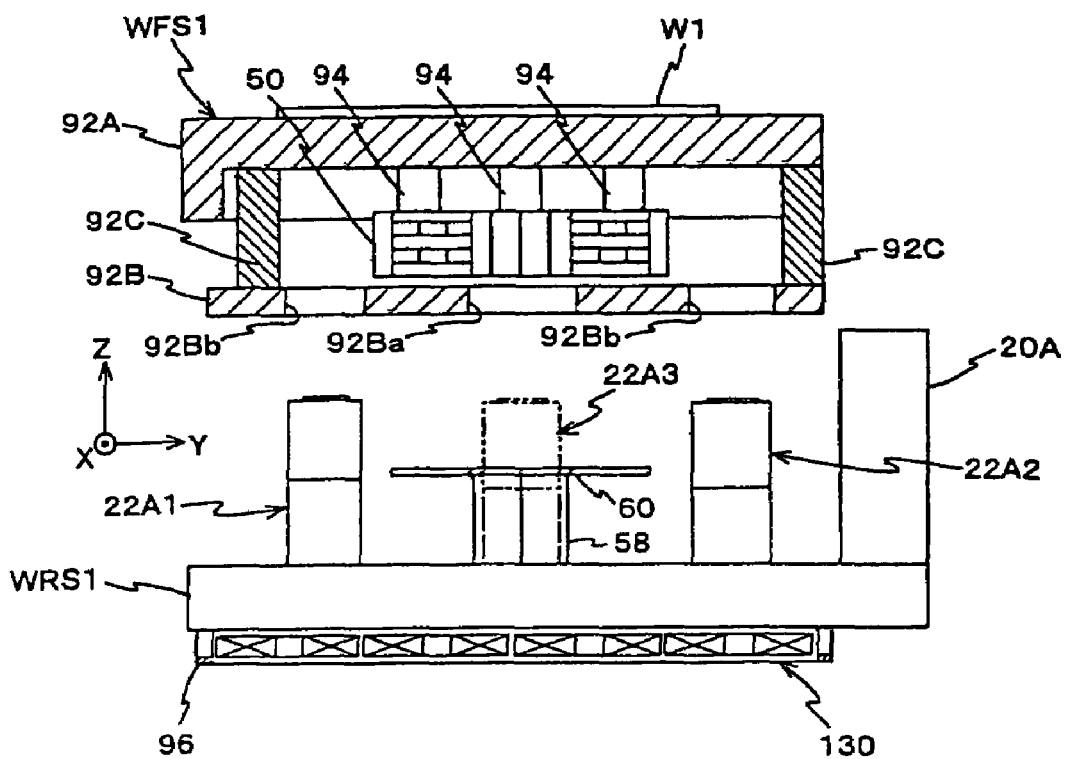
FIG. 3B

FIG. 6A
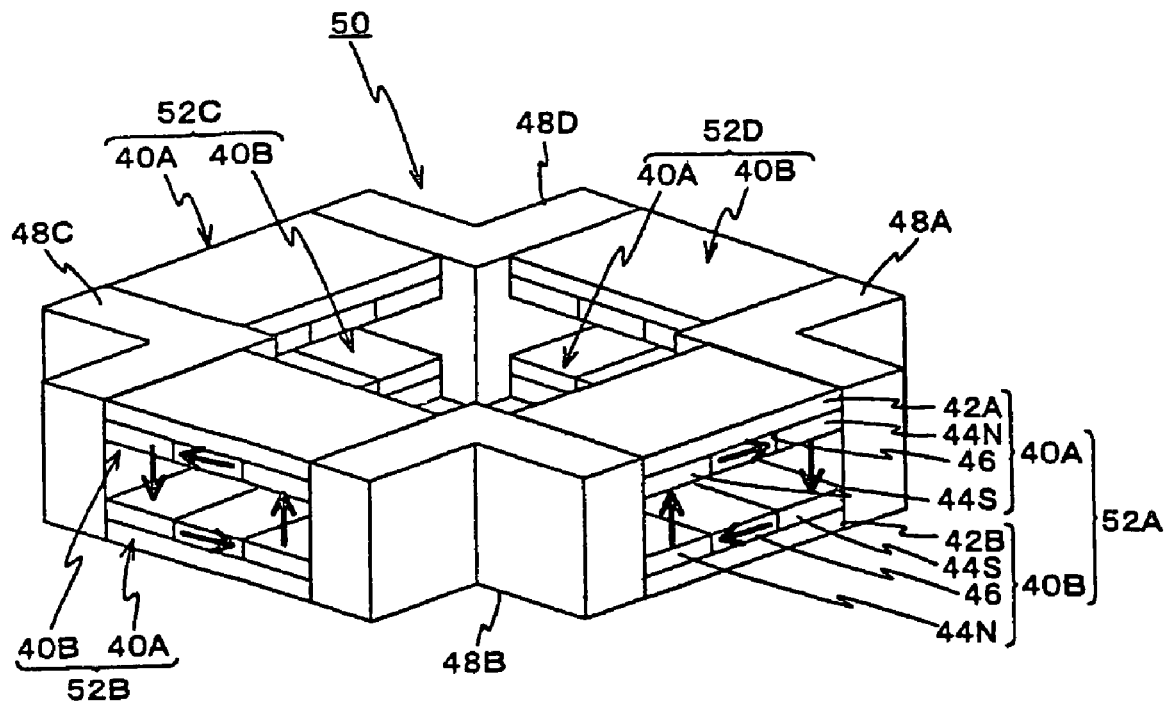
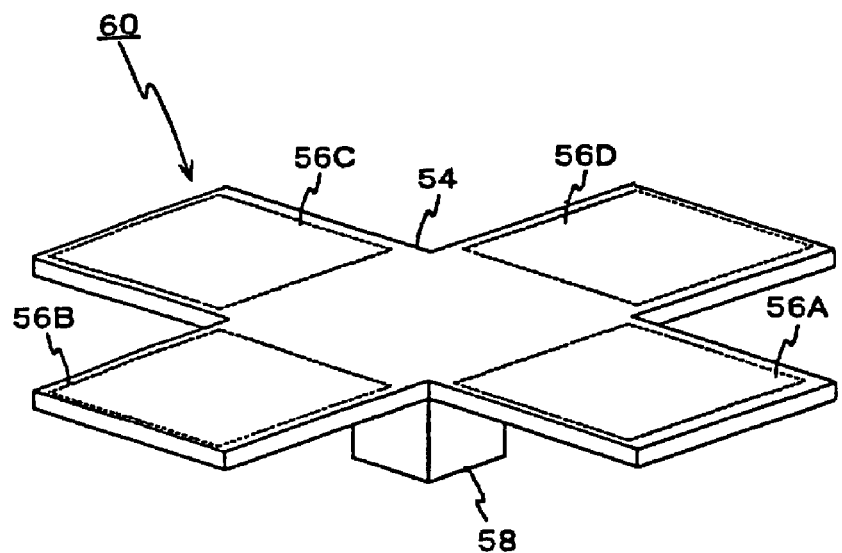
FIG. 6B

FIG. 9
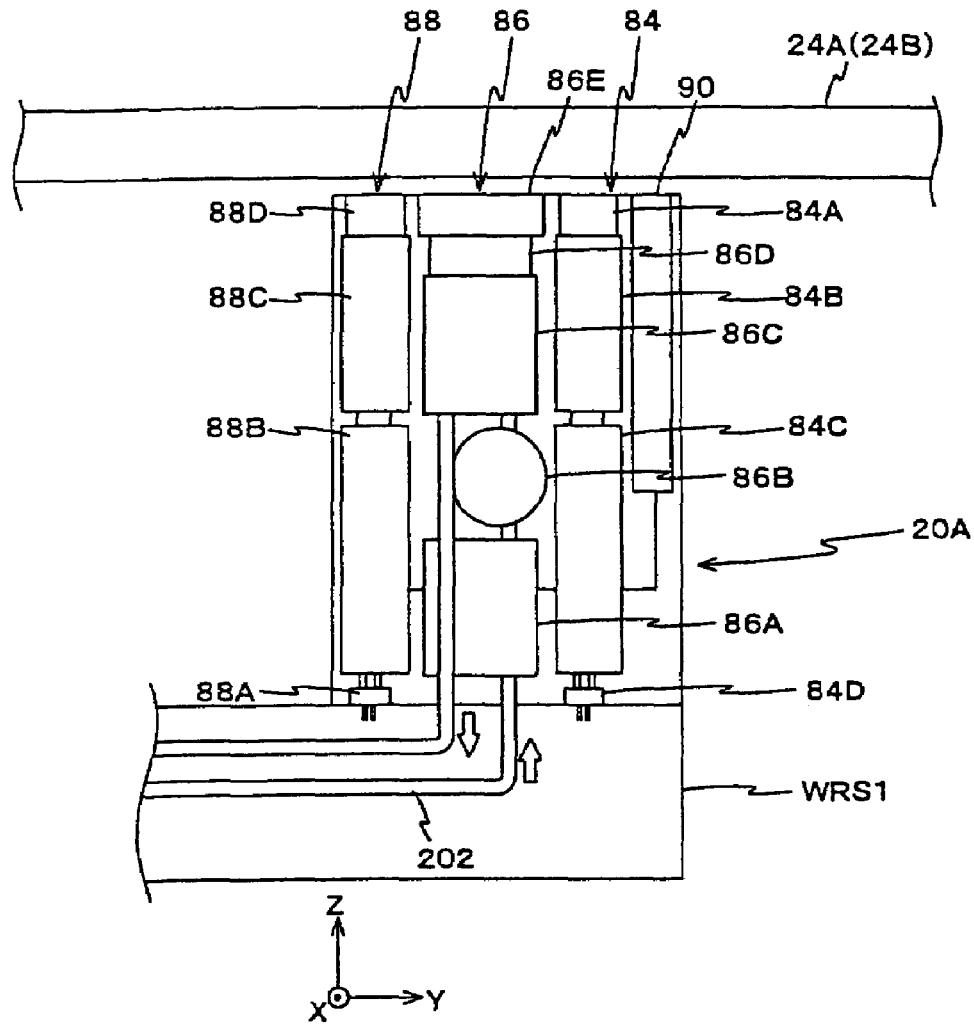
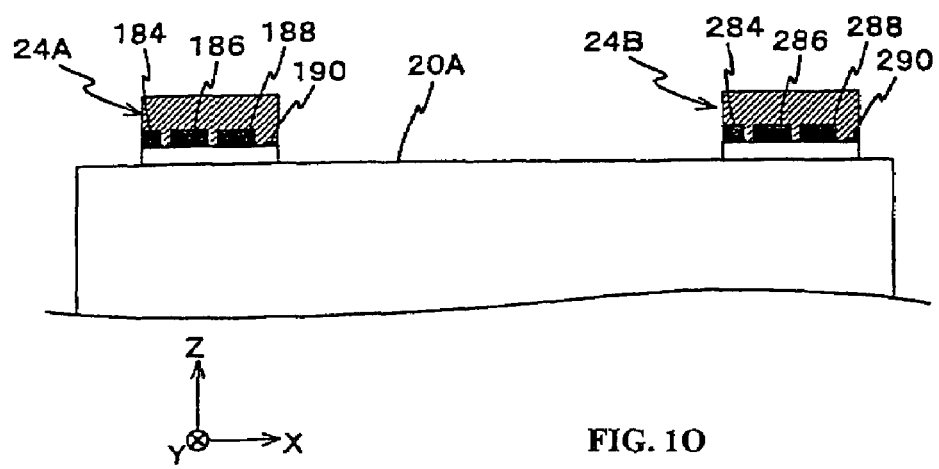
FIG. 10

FIG. 12A
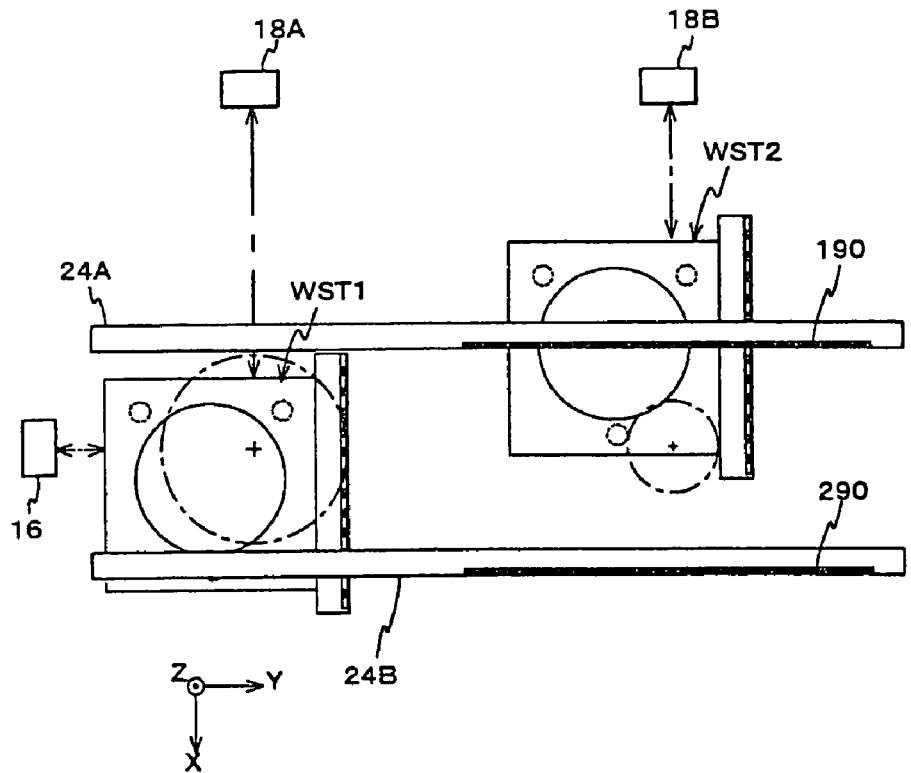
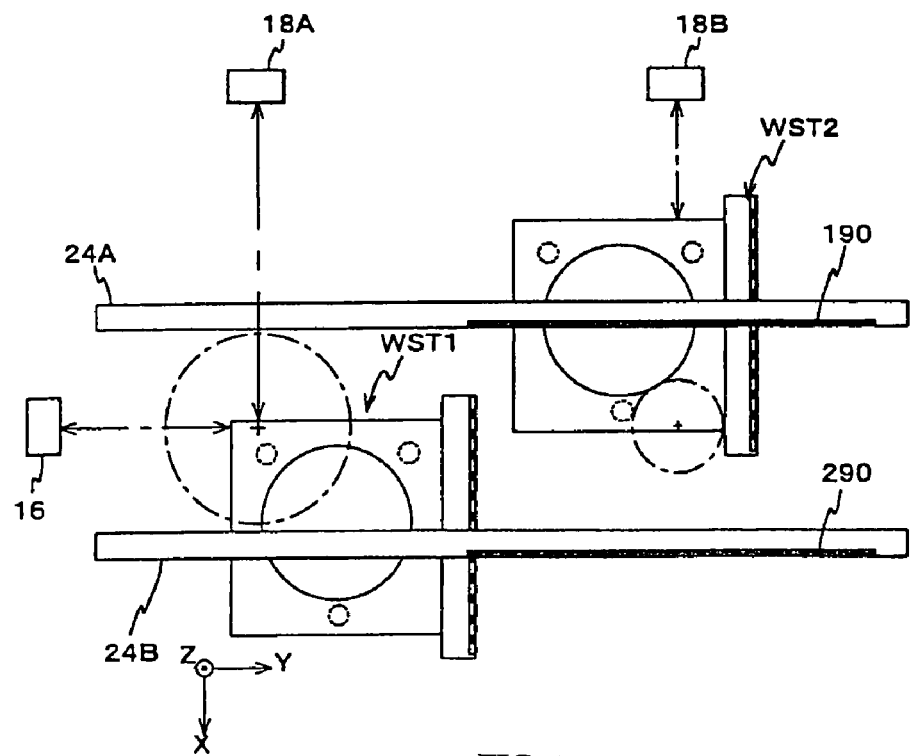
FIG. 12B

FIG. 13A
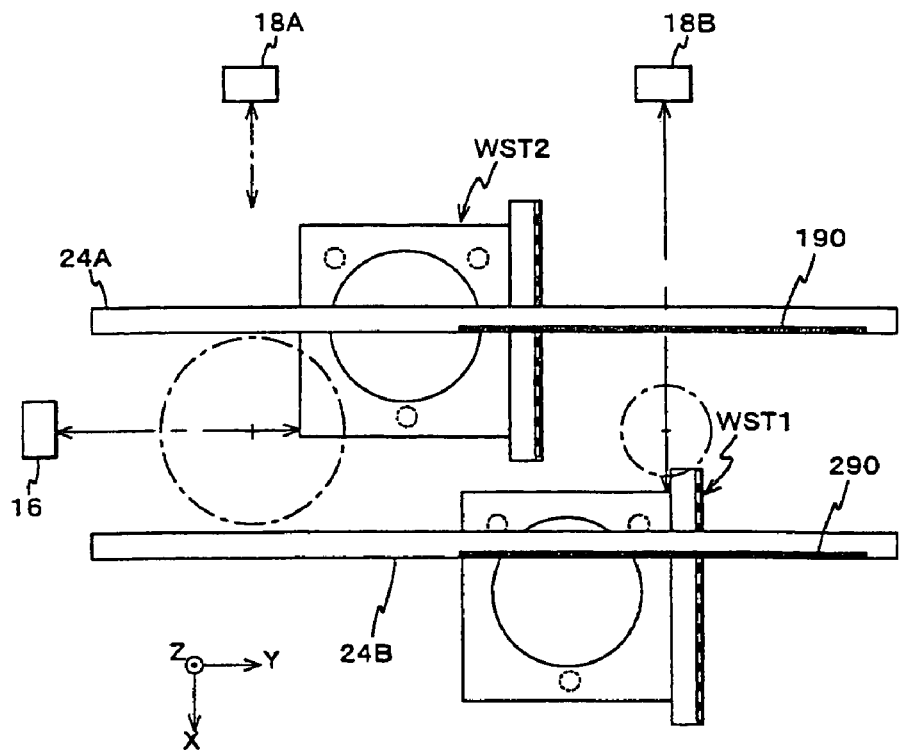
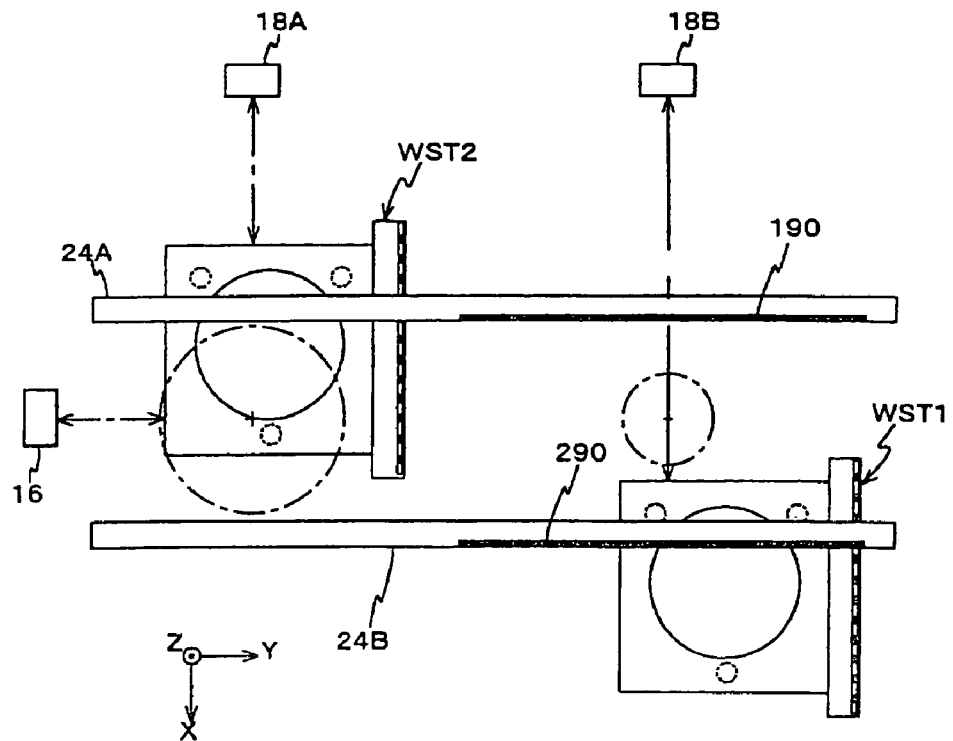
FIG. 13B

MOVABLE-BODY APPARATUS, EXPOSURE APPARATUS AND METHODS COMPRISING SAME, AND DEVICE-MANUFACTURING METHODS

FIELD

This disclosure relates to movable-body apparatus, to exposure apparatus comprising same, to exposure methods using same, and to device-manufacturing methods. More specifically, the disclosure relates to movable-body apparatus that comprise a movable body that moves in the direction of at least one axis in a horizontal plane.

BACKGROUND

In recent years, sequential-motion exposure apparatus such as the following have mainly been used in lithography processes for the manufacture of semiconductor devices, liquid-crystal-display elements, and the like, with increasingly greater integration of semiconductors and the like: step-and-repeat type reduction projection-exposure apparatus (so-called "steppers"), and step-and-scan type scanning projection-exposure apparatus (so-called "scanning steppers" or "scanners"). These exposure apparatus make possible the formation of fine patterns on a photosensitive body with good accuracy and high throughput.

In these types of exposure apparatus, a wafer stage is used as a movable-body apparatus for moving a photosensitive body (hereinafter "wafer") such as a wafer, glass plate, or the like. The wafer stage comprises a rough stage, which is driven within a two-dimensional (X-Y) plane using a biaxial linear motor, planar motor, or the like, and a fine stage that supports the wafer on the rough stage and is driven finely in the Z-axis direction, in an inclined direction, or the like, using a voice-coil motor or the like.

In these movable-body apparatus, the actuators (linear motor, planar motor, voice-coil motor, or the like) comprise an armature unit comprising a plurality of coils and a magnet unit comprising a plurality of magnets. The coils emit heat due to electric current being supplied to the coils of the armature unit. To suppress adverse influences of this heat on exposure accuracy, a conduit is conventionally connected to part of the wafer stage, and coolant is circulated through the conduit to the vicinity of the heat-producing portion of the wafer stage. Unfortunately, since the coolant conduit must be pulled along with movements of the stage, the controllability of wafer positioning is reduced, which reduces exposure accuracy.

Also, a conventional wafer stage has wiring or the like connected to it to supply electrical current to the actuator(s). This wiring also must be, similar to the coolant conduit, pulled along with motions of the stage. This need to pull and carry the wiring also is a cause of reduced controllability of wafer positioning.

SUMMARY

The present invention was developed in view of the shortcomings of conventional devices summarized above. According to a first aspect, movable-body apparatus are provided. A first embodiment of such an apparatus comprises a movable body and a driving device. The driving device drives the movable body in the direction of at least one axis in a predetermined plane. The apparatus also comprises a waste-heat member situated in a non-contacting manner with the movable body. The waste-heat member absorbs heat radiated from the movable body. Thus, thermal influences of the movable body are suppressed without a need to connect a coolant conduit to the movable body, which eliminates decreases in movement accuracy conventionally caused by tension of such a conduit on the movable body.

A second embodiment of a movable-body apparatus comprises a movable body. An electric-power-input unit is situated on the movable body and is configured to receive electric power in a wireless manner. An electric-power-output unit is situated in a non-contacting manner relative to the movable body so as to remain continually in opposing relationship to the at least a portion of the electric-power-input unit. The power-output unit outputs electric power wirelessly to the power-input unit. The actuator for the movable body uses the electric power received by the power-input unit for driving the movable body. This configuration eliminates the necessity of using wiring to supply electric power to the actuator(s) of the driving device that drive the movable body. Consequently, decreases in movement accuracy of the movable body due to the tension of the wiring are eliminated.

A third embodiment of a movable-body apparatus comprises a movable body. A meter is situated on the movable body. A transmitter, also situated on the movable body, wirelessly transmits a signal output from the meter. A receiver is situated in a non-contacting manner with the movable body so as to remain in a continuously opposing relationship to at least a portion of the transmitter. Thus, the receiver receives the signal transmitted wirelessly from the transmitter. With such a configuration, it is unnecessary to connect wiring for delivering a signal, output from a detector, to the movable body. This configuration eliminates drops in movement accuracy of the movable body, experienced in conventional apparatus due to the tension of such wiring on the movable body.

According to another aspect, exposure apparatus are provided for exposing an exposure body (e.g., wafer) and forming a pattern on the exposure body. An embodiment of such an exposure apparatus comprises at least one movable-body apparatus such as any of the embodiments summarized above. The exposure body is placed on the movable body for exposure. As a result of the benefits summarized above, since the exposure body is placed on the movable body, declines in movement accuracy experienced with conventional apparatus are eliminated. Hence, with the instant embodiments, the exposure body can be moved with higher accuracy and exposed with higher exposure accuracy.

A second embodiment of an exposure apparatus comprises at least one movable-body apparatus, as summarized above. The movable body apparatus comprises at least first and second movable bodies. As a first exposure body, held on the first movable body at an exposure location, is being exposed, a second exposure body can be placed on the second movable body to await exposure. The exposure location is situated in the X-Y plane noted above. When exposure of the first exposure body is completed, the first movable body moves away from the exposure position and the second movable body moves into the exposure position. Use of multiple movable bodies allows high-accuracy alignments of the exposure bodies. By exchanging one movable body with another movable body at the exposure position, a next exposure body can be exposed at the same predetermined plane as the first exposure body. Thus, multiple exposure bodies are exposed accurately in a successive manner and at high accuracy and throughput.

According to another aspect, exposure methods are provided for forming a pattern on an exposure body. An embodiment of such a method comprises placing an exposure body on a movable body of a movable-body apparatus, as summarized above, for exposure of the exposure body. These methods eliminate drops in exposure accuracy that otherwise would be experienced by conventional apparatus. The exposure body can be moved with high accuracy for high-accuracy exposure.

In another embodiment of an exposure method, one of multiple movable bodies is disposed at an exposure position where exposure of a first exposure body is performed in the predetermined plane. The movable bodies are driven so that, as the first exposure body is being exposed, a second exposure body is being loaded on a second movable body. When exposure of the first exposure body is completed, the second movable body moves the second exposure body into position for exposure. This method provides highly accurate exposure alignment and exposure of the exposure bodies. This method also improves throughput by allowing rapid successive positioning and exposure of multiple exposure bodies.

This invention also provides improved manufacturability of highly integrated micro-devices by including exposure methods, as summarized above, in the device-fabrication methods and/or by employing exposure apparatus as summarized above. Consequently, from yet another perspective, the present invention encompasses device-manufacturing methods that include a process for transferring a pattern to a substrate using one of the subject exposure methods or one of the subject exposure apparatus.

BRIEF DESCRIPTION OF THE DRAWINGS

FIG. 3(A) is a vertical cross-sectional view of the wafer stage WST1.

FIG. 3(B) shows a breakdown of FIG. 3(A).

FIG. 6(A) is a perspective view of the movable element of the fine-movement mechanism.

FIG. 6(B) is a perspective view of the fixed element of the fine-movement mechanism.

FIG. 9 depicts the internal configuration of the power-receiving, heat-dissipating arm of the wafer stage.

FIG. 10 depicts details of the internal configuration of the power-transmitting, waste-heat frame.

FIGS. 12(A) and 12(B) are a first set of drawings depicting parallel-processing operation in the exposure apparatus.

FIGS. 13(A) and 13(B) are a second set of drawings depicting parallel-processing operation in the exposure apparatus.

DETAILED DESCRIPTION

Embodiments of the invention are described below with reference to the figures.

Figure 1:
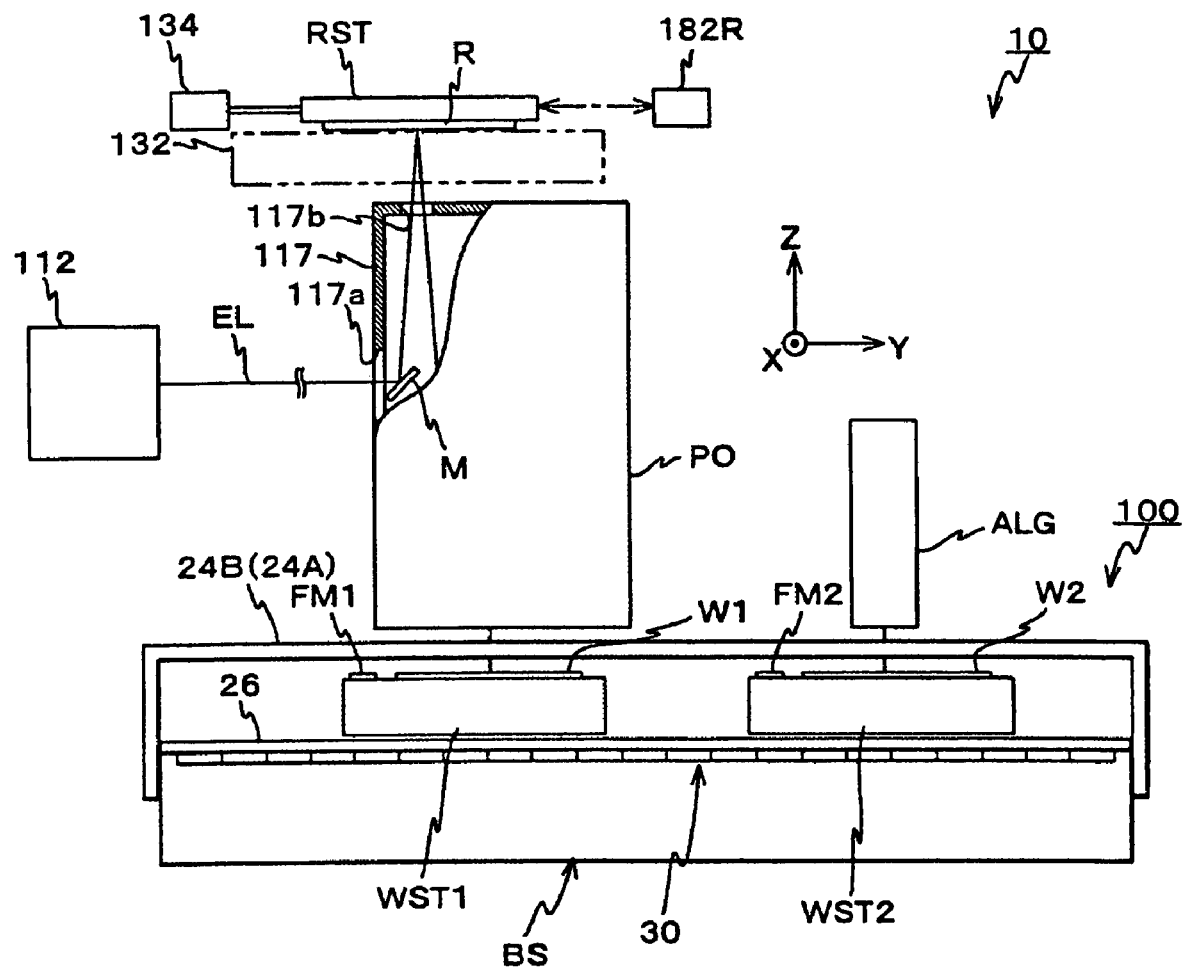
FIG. 1 is a schematic drawing showing an exposure apparatus according to an embodiment.

FIG. 1 is a schematic elevational view of the overall configuration of an embodiment of an exposure apparatus. In the depicted exposure apparatus 10, as discussed below, a projection-optical system PO is used. In the following description, the Z-axis direction is the direction of the optical axis of the projection-optical system PO, the Y-axis direction is the left and right directions orthogonal to the Z-direction, within the surface of the page in FIG. 1, and the X-axis direction is the direction orthogonal to the surface of the page.

The exposure apparatus 10 projects an image of part of a circuit pattern, defined on a reticle R, via the projection-optical system PO onto a wafer W1 (or wafer W2), while relatively scanning the reticle R and wafer W1 (or wafer W2) in a one-dimensional direction (here, the Y-axis direction) with respect to the projection-optical system PO. To transfer-expose the entire circuit pattern of the reticle R, successive exposures of respective portions thereof are performed in a step-and-scan manner onto respective shot regions on the wafer W1 (or wafer W2).

The exposure apparatus 10 comprises a light source 112 that emits EUV light (light in the soft X-ray region) as illuminating light EL and an illumination-optical system (not shown). A bending mirror M, present inside the mirror tube of the projection-optical system PO, is actually part of the illumination-optical system. The bending mirror M deflects the illuminating light EL from the light source 112 to cause the light EL to enter the pattern plane at a predetermined angle of incidence. The pattern plane is the lower plane (the −Z-side plane) of the reticle R. The angle of incidence is, for example, 50 mrad. The exposure apparatus 10 also comprises a reticle stage RST for holding the reticle R and a projection-optical system PO for projecting the illumination light (EUV light) EL, reflected by the pattern plane of the reticle R, perpendicularly with respect to the exposure plane. The exposure plane is the upper plane (the +Z-side plane) of the wafer W1 (or wafer W2). The exposure apparatus 10 also includes an alignment system ALG and a wafer-stage apparatus 100. The wafer-stage apparatus 100 includes a first wafer stage WST1 for holding a first wafer W1 and a second wafer stage WST2 for holding a second wafer W2. In this embodiment, the reticle stage RST, projection-optical system PO, and wafer stages WST1, WST2, and the like, are actually contained within a vacuum chamber (not shown).

The light source 112 comprises a laser-excited plasma light source, for example. The laser-excited plasma light source directs a high-intensity laser beam at an appropriate target material, which excites the target material to a high-temperature plasma state. The plasma generates a mixture of EUV light, ultraviolet light, visible light, and light of other wavelengths. In this embodiment, EUV light mainly of wavelengths 5 to 20 nm, for example (more specifically 11 nm) as the illumination light EL.

The illumination-optical system comprises an illumination mirror, a wavelength selecting window or the like (neither is shown), and the bending mirror M. The illuminating light EL, emitted by the light source 112 and passed through the illumination-optical system (EUV light EL reflected by the bending mirror M discussed above), is shaped into an arc-shaped slit beam and illuminates the pattern plane of the reticle R.

The reticle stage RST is situated on a reticle-stage base 132 disposed in the X-Y plane. The reticle stage RST is magnetically levitated and supported on the reticle-stage base 132 by a magnetic levitational force generated by a two-dimensional linear actuator, for example, of the reticle-stage driving system 134. The reticle stage RST is driven at a predetermined stroke in the Y-axis direction by the driving force generated by the reticle-stage driving system 134. Meanwhile, the reticle stage RST is also driven small amounts in the X-axis direction and $\theta_z$ (rotation about the Z-axis). The reticle stage RST also can be driven a small amount in various inclined directions including the $\theta_x$ direction (rotation about the X-axis) and the $\theta_y$ direction (rotation about the Y-axis) with respect to the Z-axis direction and the −Y plane. These small motions are made by corresponding adjustments, in multiple locations, of the magnetic levitational force generated by the reticle-stage driving system 134.

An electrostatic-type chuck (or mechanical-type chuck, not shown) is situated on the lower-surface side of the reticle stage RST for holding the reticle R. The reflective reticle R is held by the reticle holder. The reticle R comprises a thin plate made of a material such as a silicon wafer, quartz, low-expansion glass, or the like. On the −Z-side surface (pattern surface) of the reticle, a multilayer film is formed for reflecting EUV light. The multilayer film comprises, for example, approximately 50 layer-pairs of alternating films of molybdenum (Mo) and beryllium (Be) at a period of 5.5 nm. The multilayer film has a reflectance of approximately 70% for incident EUV light having a wavelength of 11 nm. Similar types of multilayer films are formed on the reflective surfaces of the bending mirror M and of the other mirrors in the illumination-optical system. The pattern is defined on the pattern surface of the reticle R by corresponding regions and voids in a layer of nickel (Ni) or aluminum (Al), for example, coated as an absorbing layer over the multilayer film on the pattern surface of the reticle R. Thus, the absorbing layer is patterned with a desired circuit pattern.

The position (including $\theta_Z$ rotation) in the X-Y plane of the reticle stage RST (reticle R) is continually detected at a resolution of approximately 0.5 to 1 nm, for example, by a reticle laser interferometer (hereinafter "reticle interferometer") 182R. The reticle interferometer 182R projects a laser beam onto a reflective surface situated or formed on the reticle stage RST.

The position of the reticle R in the Z-axis direction is measured by a reticle-focus sensor (not shown). The reticle-focus sensor comprises a multipoint focal-position-detecting system such as that disclosed in Japan Laid-Open Patent Document No. Hei 06-283403 (corresponding to U.S. Pat. No. 5,448,332), incorporated herein by reference.

Measurement data obtained by the reticle interferometer 182R and the reticle-focus sensor are routed to a controller (not shown). The reticle stage RST is driven by the controller, via the reticle-stage driving unit 134, based on the measurement data.

The projection-optical system PO is a reflecting optical system comprising, for 11-nm exposure light, only reflecting optical elements (mirrors). The projection-optical system PO has a numerical aperture (NA) of 0.1, for example, and has as projection power of ¼, for example. Consequently, EUV light EL reflected by the reticle R, and including "information" concerning the pattern defined on the reticle R, is projected onto the wafer W1 (W2). The projected pattern on the wafer W1 (W2) is reduced (relative to the pattern on the reticle) by a factor of ¼.

The projection-optical system PO in this embodiment comprises a mirror tube 117 and six reflective optical elements (mirrors), for example, disposed inside the mirror tube 117. The mirror tube 117 defines an opening 117b extending through the upper wall (+Z-side wall) of the mirror tube 117 and an opening 117a extending through the −Y-side wall. The bending mirror M is disposed inside the mirror tube 117.

An off-axis alignment system ALG is situated at a position located a predetermined distance to the +Y side from the projection-optical system PO. The alignment system ALG can include an FIA (Field Image Alignment) alignment sensor that radiates broadband light at an alignment mark (or field-image meter FM1 (FM2)) on the wafer W1 (W2). The alignment system ALG receives the light reflected from the alignment mark and performs mark detection by image processing. Alternatively to an FIA alignment sensor, the alignment system ALG can include any of various other components such as an LIA (Laser Interferometric Alignment) alignment sensor, an LSA (Laser Step Alignment) alignment sensor, a scanning-probe microscope such as an AFM (atomic force microscope), or the like.

A wafer-focus sensor (not shown), such as disclosed in Japan Laid-Open Patent Document No. Hei 06-283403 (corresponding to U.S. Pat. No. 5,448,332, incorporated herein by reference) is used that desirably is of the same type as the reticle-focus sensor discussed above. The wafer-focus sensor is mounted, via a holding device, on the mirror tube 117 of the projection-optical system PO. The wafer-focus sensor measures the position, in the Z-axis direction, and the inclination of the surface of the wafer W1 or W2; the mirror tube 117 of the projection-optical system PO is used as a reference.

The wafer-stage apparatus 100 comprises a base BS. A wafer stage WST1 is disposed above the base BS for holding the first wafer W1 and moving the wafer W1 in the X-Y plane. A wafer stage WST2 is similarly used for holding the second wafer W2 and moving the wafer W2 in the X-Y plane. A wafer-stage driving system is provided for driving the stages WST1, WST2, and an interferometer system is used for measuring the positions of the stages WST1, WST2.

Figure 2:
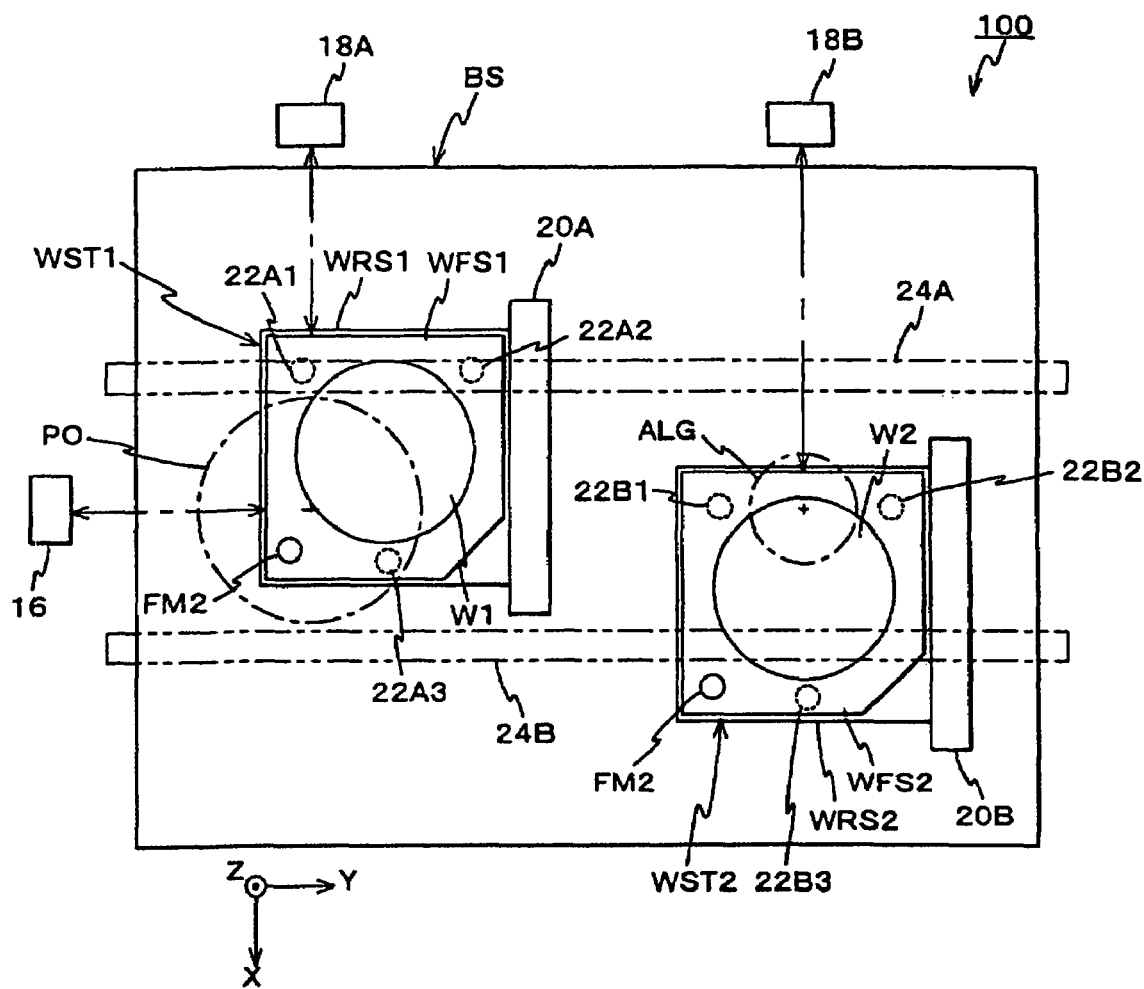
FIG. 2 is a plan view of the wafer-stage apparatus included in the FIG. 1 embodiment.

Referring to FIGS. 1 and 2, on the base BS are two power-transmitting, waste-heat frames 24A, 24B that extend lengthwise in the Y-axis direction and that are situated at a predetermined interval from each other in the X-axis direction. (FIG. 2 is a plan view of the wafer-stage apparatus 100 of FIG. 1.) Viewed from the +X direction toward the −X direction, the power-transmitting, waste-heat frames 24A, 24B have an inverted U-shape. Each of the ends is affixed to a respective end surface of the base BS in the Y-axis direction. Of these power-transmitting, waste-heat frames 24A, 24B, the lower surface of the portion parallel to the X-Y plane, positioned over the base BS, is maintained at a predetermined interval relative to the uppermost surface of the wafer stages WST1, WST2. The specific configuration, function, and the like of the power-transmitting, waste-heat frames 24A, 24B are discussed in further detail below.

Further with respect to FIG. 1, a magnet unit 30, comprising a plurality of permanent magnets, is embedded in the upper-surface side of the base BS. The magnet unit 30 constitutes part of a planar motor, as discussed below. As understood from the plan view in FIG. 4, the magnet unit 30 comprises permanent magnets 28N, 28S that are produced by sintering rare-earth materials, for example. The magnets 28N, 28S are magnetized in the Z-axis direction (vertical magnetization). The +Z-side surface of the permanent magnet 28N is its N-pole face; and the +Z-side surface of the permanent magnet 28S is its S-pole face. The permanent magnets 28N, 28S are alternately arrayed in a matrix at predetermined intervals along the X-axis direction and Y-axis direction. The permanent magnets 28N, 28S have roughly square form in the plan view (seen from above) and are of identical size.

Figure 5:
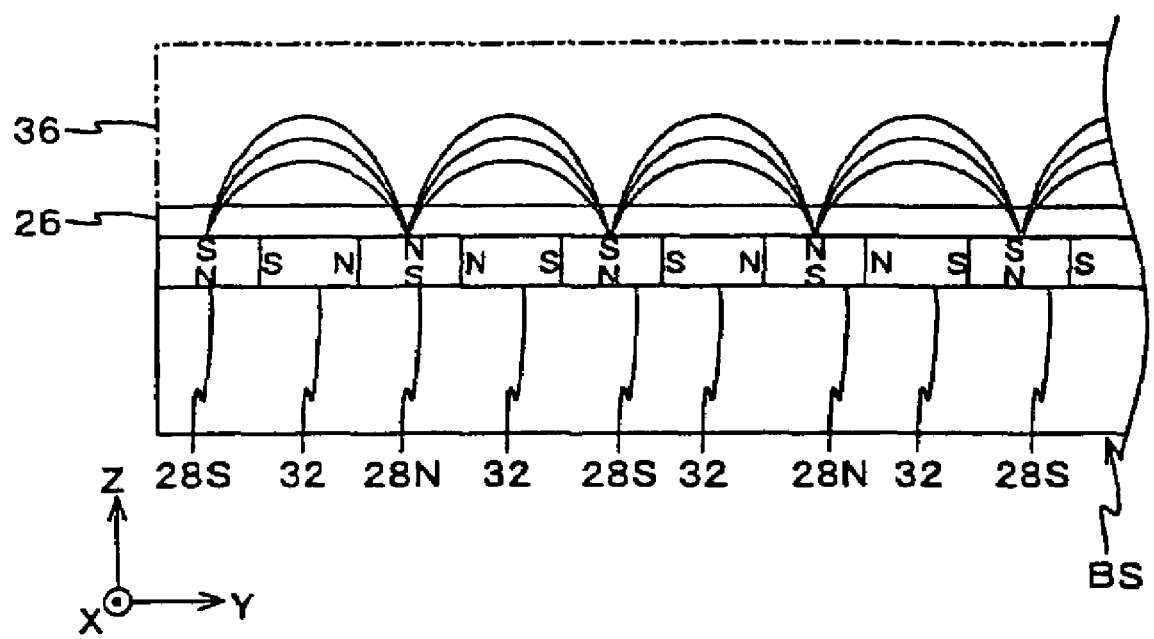
FIG. 5 shows a portion of the base BS seen from the +X direction.

The magnet unit 30 also includes permanent magnets (interpolation magnets) 32 magnetized in the X-axis direction or Y-axis direction (horizontal magnetization). The interpolation magnets 32 are situated between adjacent permanent magnets 28N, 28S. As understood from FIG. 5 showing the base BS viewed from the +X side, the surface of the interpolation magnet 32 contacting the permanent magnet 28N is its N-pole face, and the surface of the interpolation magnet contacting the permanent magnet 28S is its S-pole face. Each interpolation magnet 32 has a roughly square form in a plan view (seen from above) and is identical in size to the permanent magnets 28N, 28S. With such a magnet unit 30, a magnetic circuit can be formed (see FIG. 5) in which magnetic flux serially circles the permanent magnet 28N, the permanent magnet 28S, and the interpolation magnet 32. The interpolation magnets 32 intensify the magnetomotive force.

As shown in FIGS. 1 and 5, a protective plate 26, comprising a non-magnetic material, is situated on the upper surface of the base BS. Thus, the protective plate 26 covers the magnet unit 30 from above. The protective plate 26 prevents direct contact between the wafer stages WST1, WST2 and the permanent magnets 28N, 28S, 32, and thus prevents damage to the permanent magnets 28N, 28S, 32.

As shown in FIG. 2, the wafer stage WST1 comprises a rough stage WRS1, including a plate-shaped member having a roughly square form in the plan view (seen from above), and a fine stage WFS1 mounted on the rough stage WRS1. As understood from FIG. 3(A), showing a partial cross-section of the wafer stage WST1 seen from the +X direction, and from FIG. 3(B), showing a breakdown of the wafer stage WST1 in FIG. 3(A), an armature unit 130 is disposed on the lower surface (−Z-side surface) of the rough stage WRS1. The armature unit 130 is part of a planar motor used for driving the rough stage WRS1 (wafer stage WST1) within the X-Y two-dimensional plane.

Figure 4:
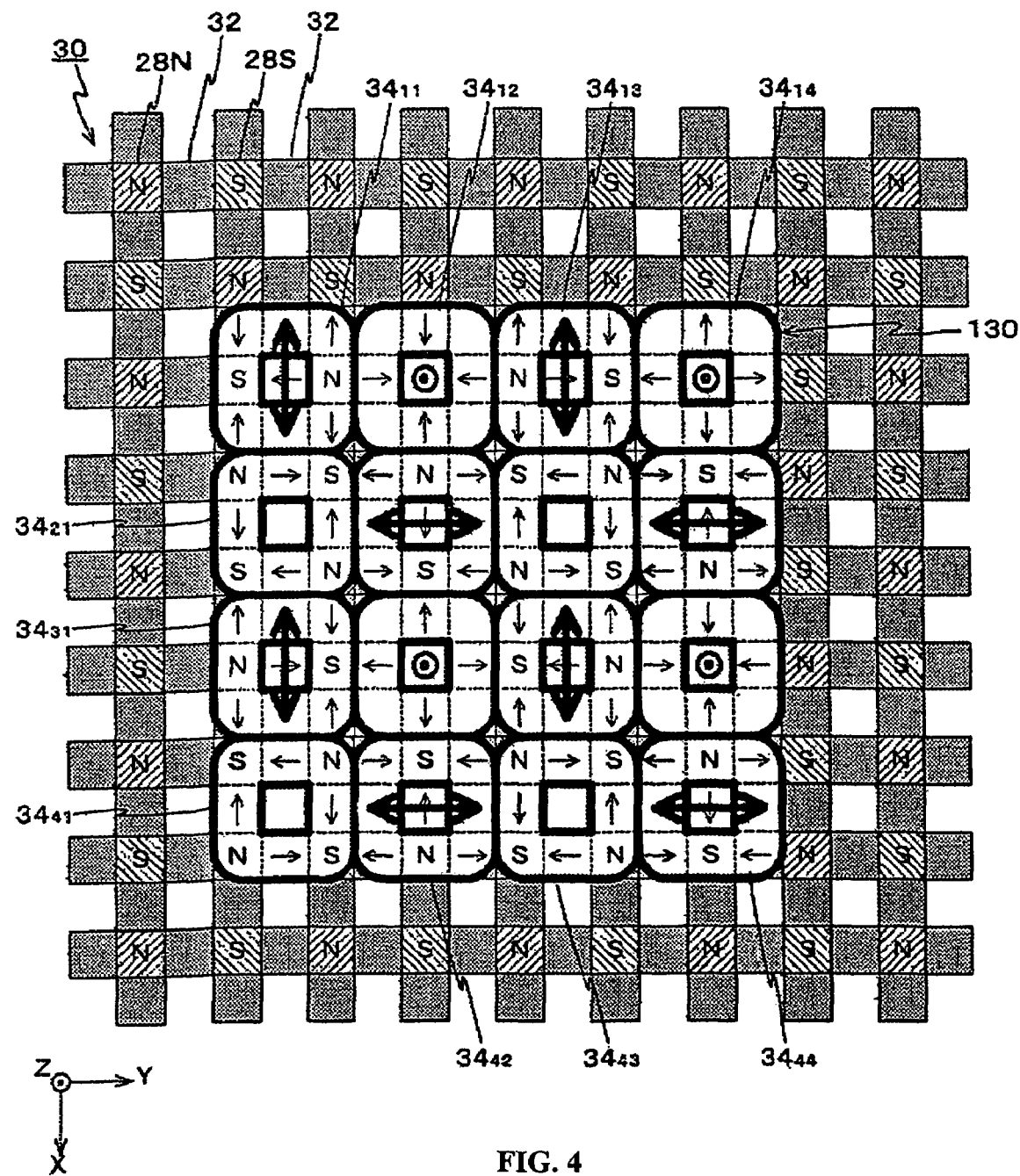
FIG. 4 shows the configuration and operation of a planar motor as used in the wafer stage.

As shown in FIG. 4, the armature unit 130 includes sixteen armature coils $34_{11}$-$34_{44}$. Electric current is supplied independently to each of these armature coils $34_{11}$-$34_{44}$. In FIG. 4, each armature coil $34_{11}$-$34_{44}$ is sized so that the length of one side is equal to the total length of a trio of permanent magnets 28N, 28S, 32.

In this embodiment, a planar motor comprising the armature unit 130 and the magnet unit 30 is situated inside the base BS. By supplying electric current to the armature coils $34_{11}$, $34_{13}$, $34_{31}$, $34_{33}$, driving force in the X-axis direction is imposed on the armature unit 130, when the armature unit 130 is at the position shown in FIG. 4. Also, by supplying electric current to the armature coils $34_{22}$, $34_{24}$, $34_{42}$, $34_{44}$, force in the Y-axis direction is imposed on the armature unit 130. Also, by supplying electric current to the armature coils $34_{12}$, $34_{14}$, $34_{32}$, $34_{34}$, force in the Z-axis direction is imposed on the armature unit 130.

In this embodiment, even in cases other than when the armature unit 130 is at the position shown in FIG. 4, driving force in the desired direction can be imposed on the armature regardless of the position of the wafer stage WST1. The proper magnitude and direction of the driving force is determined by calculating the magnitude and direction of the electric current to be supplied to each coil according to the position of the wafer stage WST1 and by varying the electric current according to the calculation results.

Consequently, in the controller (not shown), it is possible to drive the wafer stage WST1 in the desired direction by controlling the electric current supplied to each armature coil, based on the wafer-stage position data obtained by the interferometer unit (discussed below), and on the direction and velocity of movement of the wafer stage WST1.

This embodiment also includes a magnetic-body member 96 for generating magnetic attraction between the permanent magnets 28N, 28S. The magnetic-body member 96 is affixed on the lower end of the armature unit 130, as shown in FIG. 3(A). A gap of approximately several micrometers is maintained between the rough stage WRS1 and the upper surface of the base BS by a balance of the following: the magnetic attraction between the magnetic-body member 96 and the permanent magnets 28N, 28S; the empty (tare) weight of the wafer stage WST1; and the levitational force produced by the planar motor.

As shown in FIGS. 3(A) and 3(B), the fine stage WFS1 includes a table 92A that supports the wafer W1 from the lower side via a wafer holder (not shown). Also included is a plate-shaped member 92B that is suspended from and supported by multiple (three for example) hanging-support members 92C on the lower-surface side of the table 92A.

On the upper-surface side of the table 92A, as shown in FIGS. 1 and 2, a field-image meter FM1 is placed for measuring the relative relationship between the location, on the wafer surface, at which the reticle pattern is projected and the alignment system ALG (so called "baseline measurement"). The field-image meter FM1 is equivalent to a reference-mark plate of a conventional DUV exposure apparatus. Also, each of the −Y-side surface and −X-side surface of the fine-movement table 92A includes a reflective surface formed by mirror finishing.

Further with respect to FIGS. 3(A) and 3(B), a fine-movement apparatus 140, for driving the fine stage WFS1 in the X-Y plane, and empty-weight-canceling mechanisms 22A1-22A3 are situated between the fine stage WFS1 and the rough stage WRS1. The fine-movement apparatus 140 comprises a movable element 50, suspended from and supported by multiple (three, for example) of hanging-support members 94 from the table 92A of the fine stage WFS1. The fine-movement apparatus 140 also includes a fixed element 60 situated via a support member 58 on the upper surface of the rough stage WRS1. In the wafer stage WST1 shown in FIG. 3(A), the movable element 50 and the fixed element 60 are engaged (the fixed element 60 is inserted in the movable element 50). Also, the support member 58, which supports the fixed element 60, extends through an opening formed in the plate-shaped member 92B of the fine stage WFS1.

As shown in FIG. 6(A) showing a perspective view, the movable element 50 has a roughly X-shaped (cross-shaped) form in plan view (seen from above). The movable element 50 comprises four magnet units 52A, 52B, 52C, 52D, and four holding members 48A, 48B, 48C, 48D. The holding members 48A-48D are each L-shaped in plan view (seen from above) and hold the magnet units 52A-52D in a predetermined positional relationship. Each of the magnet units 52A-52D comprises a pair of magnetic-pole portions 40A, 40B, with a predetermined interval therebetween in the Z-axis direction, as shown in a representative fashion with the magnet unit 52A in FIG. 6(A). One magnetic-pole portion 40A comprises a flat plate-shaped member 42A, vertically magnetized permanent magnets 44N, 44S situated on the lower surface of the plate-shaped member 42A, and a horizontally magnetized permanent magnet (interpolation magnet) 46 disposed between the permanent magnets 44N, 44S. The lower surface (−Z-side surface) of the permanent magnet 44N is its N-pole face, and the lower surface (−Z-side surface) of the permanent magnet 44S is its S-pole face. Of the permanent magnet (interpolation magnet) 46, the surface in contact with the permanent magnet 44N is its N-pole face, and the surface in contact with the permanent magnet 44S is its S-pole face. The operation of the interpolation magnet 46 is the same as of the interpolation magnet 32 of the magnet unit 30 of the planar motor discussed above.

The other magnetic-pole portion 40B is vertically and horizontally symmetrical to the magnetic-pole portion 40A, but has the same configuration. In other words, the magnetic-pole portion 40B comprises a plate-shaped member 42B and permanent magnets 44N, 44S, 46. The upper surface (+Z-side surface) of the permanent magnet 44N is its N-pole face, and the upper surface (+Z-side surface) of the permanent magnet 44S is its S-pole face. Of the permanent magnet (interpolation magnet) 46, the surface in contact with the permanent magnet 44N is its N-pole face and the surface in contact with the permanent magnet 44S is its S-pole face. With the magnet unit 52A configured in this way, a magnetic-flux circuit as shown by the bold arrows in FIG. 6(A) is formed.

The other magnet units 52B-52D have the same configuration as described above. However, the magnet unit 52B and the magnet unit 52D are different in that the magnetic-pole portion 40A is disposed on the lower side (−Z side) and the magnetic-pole portion 40B is disposed on the upper side (+Z side).

In the movable element 50, the respective direction in which the magnet units 52A and 52C are aligned and the respective direction in which the magnet units 52B and 52D are aligned are at a 45° angle with respect to the X-axis and Y-axis. See FIGS. 7(A)-FIG. 7(C).

The fixed element 60 comprises a housing 54 having an X-shaped (cross-shaped) form in plan view (seen from above). Within the housing 54 are four armature coils 56A-56D, as shown in FIG. 6(B), which shows a perspective view of the fixed element 60.

Figure 7A:
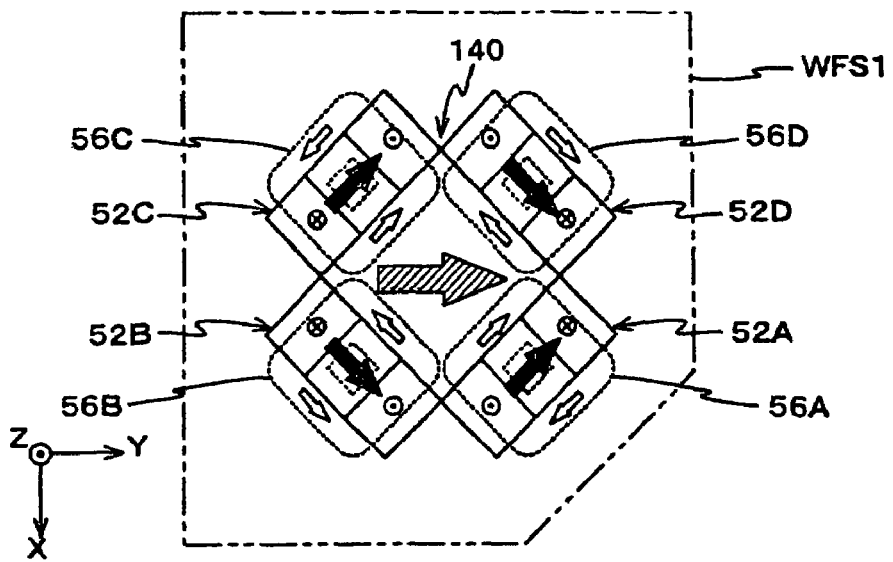
FIGS. 7(A)-7(C) depict driving of the fine stage by the fine-movement mechanism.
Figure 7B:
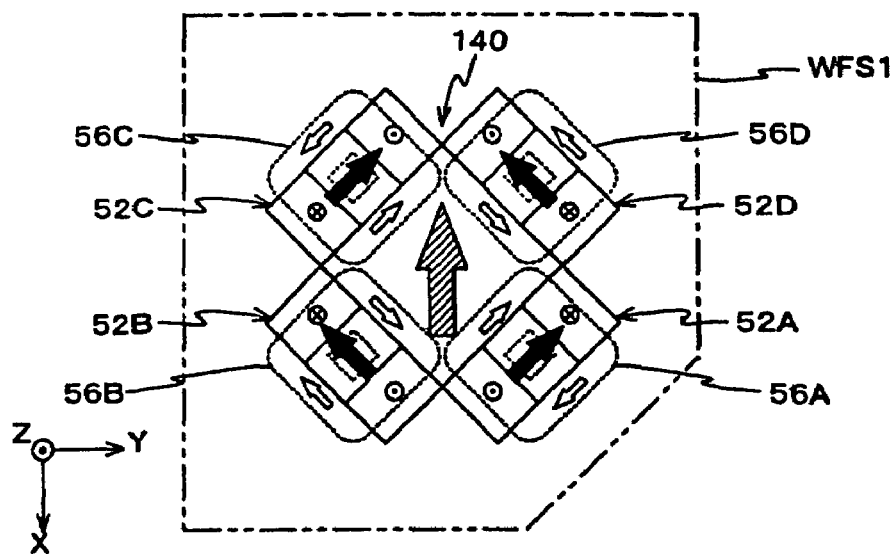
Figure 7C:
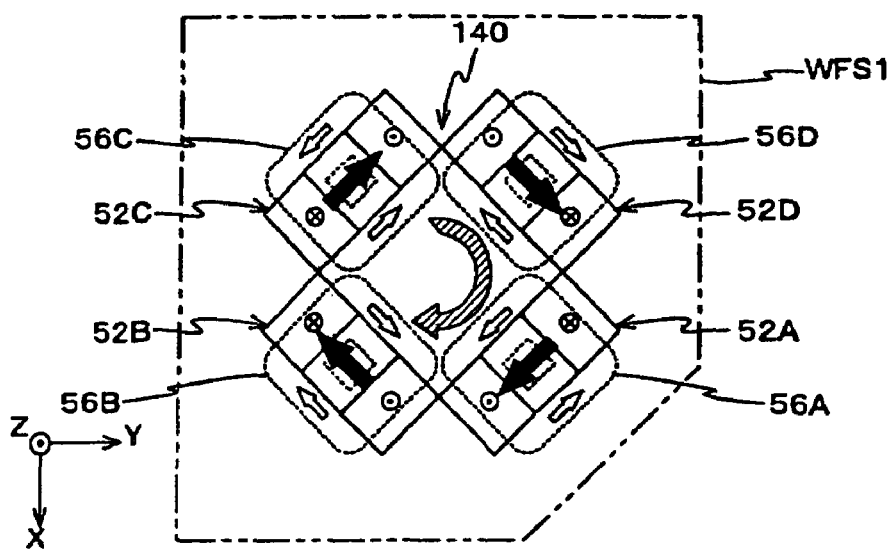

The armature coils 56A-56D are inserted between the magnetic-pole portions 40A, 40B of the magnet units 52A-52D, respectively. Due to the electromagnetic interaction of the electric current flowing through each armature coil and the magnetic field generated by each magnet unit, a force is generated in a direction inclined 45° (direction shown with the large black arrows) relative to the X-axis and Y-axis, as shown in FIGS. 7(A)-7(C). With the fine-movement apparatus 140 configured in this way, as shown in FIG. 7(A), a driving force in the direction shown by the large black arrows is generated by the following: electromagnetic interaction between the electric current flowing through each armature coil and the magnetic field formed by each magnet unit; supplying a clockwise electric current of a predetermined magnitude to the armature coils 56A, 56D (in FIG. 7(A) the direction of the electric current is indicated by large open arrows); and supplying a counterclockwise electric current of a predetermined magnitude to the armature coils 56B, 56C. From the resultant of these driving forces, a driving force in the direction (+Y direction) indicated by the large shaded arrow is imposed on the movable element 50 (fine stage WFS1). A driving force in the −Y direction can be caused to act on the movable element 50 (fine stage WFS1) by supplying electric currents, having orientations opposite to those noted above, to the coils.

As shown in FIG. 7(B), when a clockwise electric current is supplied to the armature coils 56A, 56B and a counterclockwise electric current is supplied to the armature coils 56C, 56D, a driving force in the direction indicated by the large black arrows is generated by the electromagnetic interaction between the electric current flowing through each armature coil and the magnetic field formed by each magnet unit. Due to the resultant of these driving forces, a driving force in the direction (−X direction) indicated by the large shaded arrow is imposed on the movable element 50 (fine stage WFS1). Also, a driving force in the +X direction can be imposed on the movable element 50 (fine stage WFS1) by supplying electric currents, having orientations opposite to those noted above, to the coils.

As shown in FIG. 7(C), when a counterclockwise electric current is supplied to the armature coils 56A, 56C and a clockwise electric current is supplied to the armature coils 56B, 56D, a driving force in the direction indicated by the large black arrows is generated by the electromagnetic interaction between the electric current flowing through each armature coil and the magnetic field formed by each magnet unit. Due to the resultant of these driving forces, a driving force in the direction (rotary direction around the Z-axis; clockwise) indicated by the large shaded arrow is imposed on the movable element 50 (fine stage WFS1). A driving force in the opposite rotary direction around the Z-axis (counterclockwise) can be imposed on the movable element 50 (fine stage WFS1) by supplying electric currents, having orientations opposite to those noted above, to each coil.

Returning to FIGS. 3(A)-3(B), the three empty-weight-canceling mechanisms 22A1-22A3 (in FIG. 3(A), the empty-weight-canceling mechanism 22A3 is omitted for clarity) support the fine stage WFS1 in a non-contacting manner at three points on the rough stage WRS1. Each empty-weight-canceling mechanism comprises a driving mechanism (voice-coil motor), or the like. With each of these mechanisms, the fine stage WFS1 is driven finely with three degrees of freedom in the Z-axis direction, the $\theta_x$ direction (rotation about the X-axis), and the $\theta_y$ direction (rotation about the Y-axis). The empty-weight-canceling mechanisms 22A1-22A3 extend through respective openings formed in the plate-shaped member 92B of the fine stage WFS1.

Figure 8:
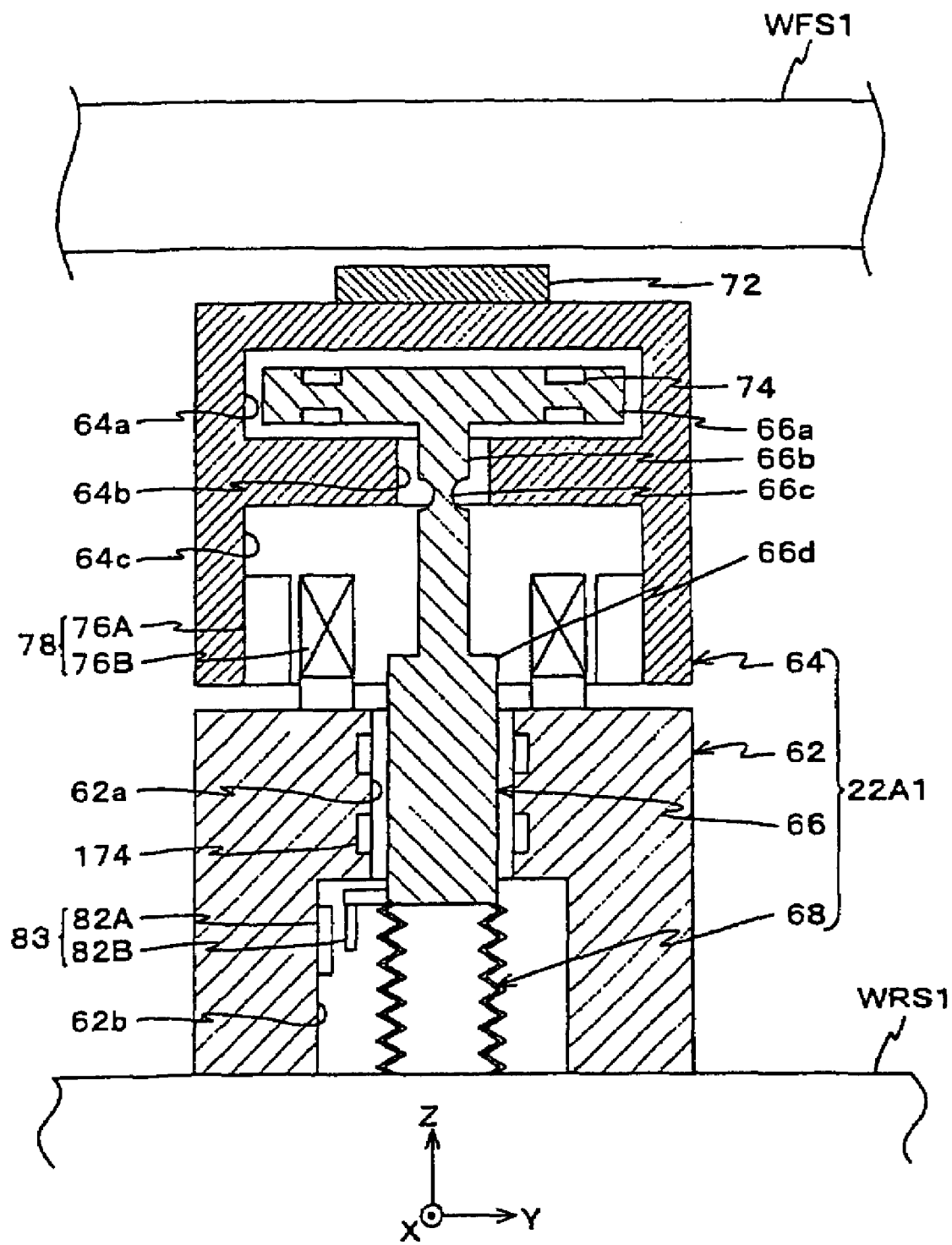
FIG. 8 is a vertical cross-sectional view of the empty-weight-canceling mechanism of the wafer stage.

Of the empty-weight-canceling mechanisms 22A1-22A3, one such mechanism 22A1 is shown in FIG. 8, which shows a vertical cross-sectional view of the empty-weight-canceling mechanism 22A1. The mechanism comprises a first member 62 affixed to the upper surface of the rough stage WRS1, a second member 64 disposed above the first member 62, a third member 66 disposed inside the first member 62 and the second member 64, and a bellows 68 connecting the lower-end surface (−Z-side surface) of the third member 66 and the upper surface (+Z side-surface) of the rough stage WRS1.

The first member 62 has a roughly columnar external form. A circular recessed portion 62b of a predetermined depth is formed on the center of the lower-end surface thereof. A circular through-hole 62a, extending to the upper surface of the first member 62, is formed in the central portion of the inner bottom face (upper surface) of the circular recessed portion 62b. Specifically, a stepped through-hole is formed by the circular recessed portion 62b and the through-hole 62a.

The second member 64 has a roughly columnar external form. A recessed portion 64c of predetermined depth and a circular cross-section is formed in the center of the lower-end surface thereof. There is a predetermined interval from the recessed portion 64c toward the +Z side. A chamber 64a has a circular cross-section and approximately the same diameter as the recessed portion 64c. A circular hole 64b, connecting the inner bottom face (upper surface) of the recessed portion 64c and inner lower surface of the chamber 64a, is formed in the second member 64. A vacuum pre-load (differential pump-type) aerostatic bearing 72 is affixed on the upper surface of the second member 64 (specifically, the upper surface of the empty-weight-canceling mechanism 22A1). The fine stage WFS1 is supported in a non-contacting manner by the empty-weight-canceling mechanism 22A1 due to the balance of the static pressure generated by the vacuum pre-load aerostatic bearing 72 and the empty (tare) weight of the fine stage WFS1. To maintain a predetermined gap between the second member 64 and the fine stage WFS1, a mechanism generating a magnetic repulsive force may be employed instead of the vacuum pre-load aerostatic bearing 72.

The third member 66 comprises a circular plate-shaped tip portion 66a having a slightly smaller form than the chamber 64a of the second member 64. A first shaft portion 66b is disposed on the lower-surface center portion of the tip portion 66a. A second shaft portion 66d, having a diameter greater than of the first shaft portion 66b, is disposed on the lower end of the first shaft portion 66b. As a whole, the third member has a T-shaped form in the Y-Z cross-section (as well as in the X-Z cross-section).

In the third member 66, a flexure 66c is formed to the upper side from the center in the height-wise direction of the first shaft portion 66b. The upper side portion (above the flexure 66c) can be oscillated (moved) relative to the lower side portion.

An air-pad 74 is situated on the upper surface and lower surface of the tip portion 66a. The air-pad 74 is not detailed in the drawing, but actually comprises a gas-exhaust opening for exhausting gas; a low-vacuum-suction opening for drawing gas, exhausted from the gas-exhaust opening, at low vacuum (e.g., approximately $10^2$ to $10^3$ Pa); and a high-vacuum-suction opening for drawing gas at high vacuum (e.g., approximately $10^{-2}$ to $10^{-3}$ Pa). The supply of gas to the air-pad 74 is achieved using a gas-supply apparatus (not shown). Gas is delivered from the gas-supply apparatus by a conduit (not shown) formed in the second member 64 and first member 62 and by a gas-supply pipe (not shown) connected with the first member 62. With the air-pad mechanism 74, a predetermined clearance (approximately several micrometers, for example) is formed between the upper and lower surfaces of the tip portion 66a of the third member 66 and the chamber 64a of the second member 64.

Multiple air-pad mechanisms 174, identical to those described above, are disposed on the inner-wall surface of the first member 62, opposite to the second shaft portion 66d of the third member 66. Thus, a predetermined clearance (approximately several micrometers, for example) is formed between the inner-wall surface of the first member 62 and the second shaft portion 66d of the third member 66.

A gas-supply conduit (not shown) is connected to the bellows 68. Gas is supplied via the gas-supply conduit from a gas-supply apparatus (not shown). Thus, the interior of the bellows 68 is maintained at a predetermined pressure.

A voice-coil motor 78 is disposed between the first member 62 and the second member 64. The voice-coil motor 78 comprises a fixed element 76B (comprising an armature coil affixed on the upper surface of the first member 62) and a movable element 76A (comprising a permanent magnet affixed on the side-wall interior surface of the recessed portion 64c of the second member 64). Using the voice-coil motor 78, the positional relationship, in the Z-axis direction, of the first member 62 and the second member 64 (and third member 66) can be varied.

An encoder 83 is disposed between the third member 66 and the first member 62. The encoder 83 comprises a scale 82B situated on the lower-end portion of the third member 66. A sensor head 82A is situated on the side-wall interior surface of the recessed portion 62b of the first member 62. The sensor head 82A comprises a radiant device directing a light beam toward the scale 82B and a light-receiving element for receiving light reflected by the scale 82B. Using the encoder 83, the positional relationship, in the Z-axis direction, between the first member 62 and third member 66 can be detected.

The other empty-weight-canceling mechanisms 22A2, 22A3 are configured in the same way as the empty-weight-canceling mechanism 22A1 described above. With the empty-weight-canceling mechanisms 22A1-22A3 configured in this way, the fine stage WFS1 can be supported with low rigidity at three points via the third member 66, second member 64, air-pad mechanism 72, and bellows 68 thereof. The rigidity of the bellows 68 is not completely zero. Based on the measurement data obtained by the encoder 83, the voice-coil motor 78 can be driven finely so as to negate the rigidity of the bellows 68. Also, using the controller (not shown) the electric current for driving in the Z-axis direction can be supplied, in combination with the electric current for negating the rigidity of the bellows, to the coil of the fixed element 76B of the voice-coil motor, to apply a driving force, in the Z-axis direction, on the fine stage WFS1.

Returning to FIG. 2, a power-receiving, heat-dissipating arm 20A is disposed on the +Y-side end portion of the upper surface of the rough stage WRS1. The power-receiving, heat-dissipating arm 20A is situated such that part of the upper surface thereof confronts at least one lower surface of the power-transmitting, waste-heat frames 24A, 24B. This is because the length of the power-receiving, heat-dissipating arm 20A in the X-axis direction (i.e., width direction) is longer (wider) than the interval between the power-transmitting, waste-heat frames 24A, 24B discussed above.

The interior of the power-receiving, heat-dissipating arm 20A, as well as of the power-transmitting, waste-heat frames 24A, 24B, is described with reference to at least FIGS. 9 and 10. FIG. 9 shows the internal configuration of the power-receiving, heat-dissipating arm 20A as seen from the +X side. FIG. 10 shows an X-Z cross-section of the power-transmitting, waste-heat frames 24A, 24B, along with the power-receiving, heat-dissipating arm 20A. Referring to FIG. 9, a liquid-temperature-regulating system 86, an electric-power-input system 84, a signal-transmitting system 88, and a head-unit 90 constituting the encoder are disposed inside the power-receiving, heat-dissipating arm 20A.

The liquid-temperature-regulating system 86 is in the vicinity of the heat source of the rough stage WRS1 (e.g., the armature coils of the armature unit 130 of the planar motor, the armature coils 56A-56D of the fine-movement mechanism 140, the voice-coil motors of the empty-weight-canceling mechanisms 22A1-22A3, and the like). The liquid-temperature-regulating system 86 comprises a feedback unit 86A to which is connected one end of a coolant conduit 202 that conducts a coolant liquid. The liquid-temperature-regulating system 86 also includes a circulating pump 86B and a temperature-regulating unit 86C, the latter being disposed on the opposite side of the circulating pump 86B from the feedback unit 86A and to which the other end of the coolant conduit 202 is connected. A Peltier element 86D is in contact with the temperature-regulating unit 86C. A heat-dissipating unit 86E is established in contact with the surface of the Peltier element 86D opposite the temperature-regulating unit 86C.

The temperature-regulating unit 86C is a tank containing a predetermined volume of coolant liquid. The coolant liquid contained in the temperature-regulating unit 86C is cooled to a predetermined temperature by the Peltier element 86D. The heat-dissipating unit 86E has an upper surface that is substantially parallel (parallel to the X-Y plane when wafer stage WST is disposed on the base BS) to the X-Y plane. The heat-dissipating unit 86E discharges heat on the surface of the Peltier element 86D externally through radiation. The heat-dissipating unit 86E actually extends over the entire area in the X-axis direction (i.e., direction orthogonal to the surface of the page) of the power-receiving, heat-dissipating arm 20A.

In FIG. 10, a waste-heat unit 186 is provided inside the power-transmitting, waste-heat frame 24A, for absorbing heat from the heat-dissipating unit 86E. The waste-heat unit 186 extends, in the Y-axis direction, over the entire area of the power-transmitting, waste-heat frame 24A. Consequently, when the power-receiving, heat-dissipating arm 20A and the power-transmitting, waste-heat frame 24A are in vertical opposition to each other, one part of the waste-heat unit 186 is continually opposite a corresponding part of the heat-dissipating unit 86E. Coolant is supplied to the waste-heat unit 186 for efficient absorption of heat radiated from the heat-dissipating unit 86E. The same type of waste-heat unit 286 is situated inside the other power-transmitting, waste-heat frame 24B.

Returning to FIG. 9, the electric-power-input system 84 comprises a receiver 84A, a power-converting unit 84B, an A/D converter-amplifier unit 84C, and a connector 84D. A coil, for receiving electric power wirelessly, is situated in the receiver 84A. The coil extends over the entire area in the X-axis direction (the direction orthogonal to the surface of the page) of the power-receiving, heat-dissipating arm 20A.

A transmitter 184, including a transmitting coil, is housed in one power-transmitting, waste-heat frame 24A, as shown in FIG. 10. When the transmitting coil inside this transmitter 184 and the receiving coil inside the receiver 84A are in vertical opposition to each other, electric power supplied from an electric-power-supply apparatus (not shown) can be transmitted wirelessly between the transmitting coil and the receiving coil. Such a wireless power-transmission system is disclosed in Japan Examined Patent Application No. Hei 05-59660 and in Published Japan Patent Application No. Sho 58-115945, and further description of these components herein is omitted. The same type of transmitter 284, including a transmitting coil, is housed within the other power-transmitting, waste-heat frame 24B. When the transmitting coil in the transmitter 284 and the receiving coil in the receiver 84A are in vertical opposition to each other, wireless electric-power transmission can be made between the transmitting coil and the receiving coil.

Thus, electric power, supplied from the power-transmitting, waste-heat frame 24A or 24B and received by the receiver 84A of the electric-power-input system 84 in FIG. 9, is converted to electric current in the power-converting unit 84B. Using the A/D converter-amplifier unit 84C, this electric power undergoes analog-to-digital (A/D) conversion and amplification. The amplified power is supplied via the connector 84D to the coils of the driving mechanism for driving the rough stage WRS1 (e.g., coils $34_{11}$-$34_{44}$ constituting the armature unit 130 of the planar motor, the coils included in the fixed element of the voice-coil motors 78 of the empty-weight-canceling mechanism 22A1-22A3, and the armature coils 56A-56D of the fine-movement mechanism 140, and the like). This electric current also can be supplied to the Peltier element 86D and the pump 86B of the liquid-temperature-regulating system 86 discussed above. This electric current also can be supplied to the wafer holder if the wafer holder for holding a wafer W1 on the fine stage WFS1 is an electrostatic wafer holder. The supply of electric current between the rough stage WRS1 and the fine stage WFS1 can be performed wirelessly with the power-transmission system discussed above.

The signal-transmitting system 88 comprises a connector 88A, an A/D converter-amplifier unit 88B, a wireless-signal generator 88C, and a transmitter 88D. As shown in FIG. 10, a receiver 188, corresponding to the transmitter 88D, is situated in one power-transmitting, waste-heat frame 24A, and a receiver 288 is situated in the other power-transmitting, waste-heat frame 24B. With the signal-transmitting system 88 and the receiver 188 (or 288), measurement data obtained by the sensor associated with the field-image meter FM1 or the like on the fine stage WFS1 can be transmitted wirelessly from the transmitter 88D of the signal-transmitting system 88 to the receiver 188 (or 288). The signal interchange between the transmitter 88D and receiver 188 (or 288) can be by infrared beam, for example. It is also possible to use other waves such as radio waves, acoustic waves, or the like.

The signal-transmitting system 88 can be configured both to transmit and to receive. The control signal from the controller (not shown) to the wafer stage WST1 can be transmitted via the signal-transmitting system 88 and the receiver 188 (or 288). The receiver 188 (288) need not extend over the entire area in the Y-axis direction of the power-transmitting, waste-heat frame 24A (24B), so long as the receiver 88D is positioned to allow field-image measurement, or the like, being performed on the wafer stage WST1.

Figure 11:
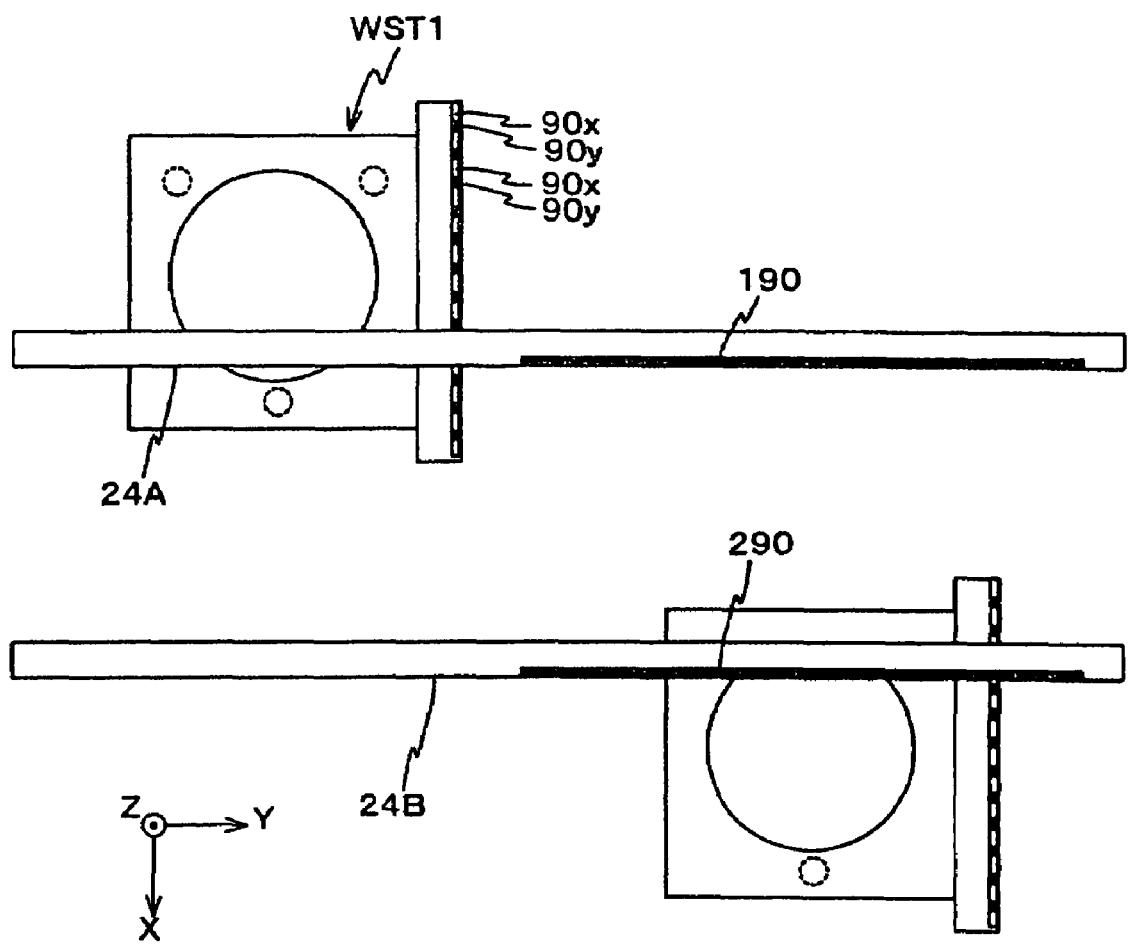
FIG. 11 shows the heads established on the wafer stage and the scales established on the power-transmitting, waste-heat frame.

As shown in FIG. 11, the head unit 90 comprises multiple heads 90y for performing measurements, in the Y-axis direction, pertaining to position in the Y-axis direction. Multiple heads 90x also are provided for performing measurements, in the X-axis direction, pertaining to position in the X-axis direction. The heads 90y are arranged at predetermined intervals in the X-axis direction, and the heads 90x are arranged at predetermined intervals in locations that do not interfere with the heads 90y.

A scale 190 is situated on the bottom face of one power-transmitting, waste-heat frame 24A, and a scale 290 is situated on the bottom face of the other power-transmitting, waste-heat frame 24B. The scales 190, 290 define a two-dimensional lattice formed at a predetermined period in the X-direction and Y-direction, established from the vicinity of the +Y end to the vicinity of the central portion of the power-transmitting, waste-heat frames 24A, 24B, respectively. Using the head unit 90 and scales 190, 290, measurements can be performed of position, in the X-axis direction, of the wafer stage WST1. These measurements are performed at a head 90x, from among multiple heads for measuring in the X-axis direction, opposite the scale 190 or 290. Measurements also can be performed of position, in the Y-axis direction, of the wafer stage WST1. These measurements are performed at a head 90y, from among multiple heads for measuring in the Y-axis direction, opposite the scale 190 or 290. The intervals between neighboring heads 90x and the intervals between neighboring heads 90y allow position measurements to be performed using the scale 190 (or 290) at the same time if the head unit 90 comprises multiple heads. It is alternatively possible to use only one head if the measurement range can be covered.

Returning to FIG. 2, the other wafer stage WST2 has the same configuration as the wafer stage WST1 discussed above. Specifically, the wafer stage WST2 comprises a rough stage WRS2 that is similar to the rough stage WRS1. The wafer stage WST2 also includes a fine stage WFS2 that is similar to the fine stage WFS1. The wafer stage WST2 is mounted using three empty-weight-canceling mechanisms 22B1, 22B2, 22B3 situated at three respective locations (not on a straight line) on the rough stage WRS2. A field-image meter FM2 is situated on the upper surface of the fine stage WFS2. A fine-movement mechanism, similar to the fine-movement mechanism 140 discussed above, is situated between the rough stage WRS2 and fine stage WFS2. A power-receiving, heat-dissipating arm 20B, similar to the power-receiving, heat-dissipating arm 20A discussed above, is situated in the vicinity of the +Y-side end portion of the rough stage WRS2. In the power-receiving, heat-dissipating arm 20B, as in the power-receiving, heat-dissipating arm 20A discussed above, reception of heat generated in the wafer stage WST2, wireless transmission of electric power, transmission and reception of signals detected by the field-image meter FM2 on the wafer stage WST2, and detection of the position in the X-Y plane of the wafer stage WST2, can be performed between the power-transmitting, waste-heat frames 24A, 24B.

The interferometer system for detecting the position, in the X-Y plane, of the wafer stages WST1, WST2 is shown in FIG.

2. The interferometer system comprises an X-axis interferometer 18A that radiates a length-measuring beam parallel to the X-axis passing through the projection center of the projection-optical system PO. The interferometer system also includes a Y-axis interferometer 16 that radiates a length-measuring beam parallel to the Y-axis passing through the projection center. The interferometer system also includes an X-axis interferometer 18B that radiates a length-measuring beam parallel to the X-axis passing through the detection center of the alignment system ALG. With such an interferometer system, the length-measuring beam from the X-axis interferometer 18A is radiated on the mirror-finished reflective surface on the -X side of the fine stage WFS1, and the length-measuring beam from the Y-axis interferometer 16 is radiated on the mirror-finished reflective surface on the -Y side of the fine stage WFS1, whenever the wafer stage WST1 and the wafer stage WST2 are positioned as shown in FIG. 2. Also, the length-measuring beam from the X-axis interferometer 18B is radiated on the mirror-finished reflective surface on the -X side of the fine stage WFS2. In the situation shown in FIG. 2, the length-measuring beam of the interferometer is not radiated on the mirror-finished reflective surface on the -Y side of the fine stage WFS2.

Whenever the positional relationship of the wafer stage WST1 and wafer stage WST2 is opposite to that shown in FIG. 2, the length-measuring beam of the interferometer 18A is radiated on the -X side reflective surface of the fine stage WFS2, the length-measuring beam of the interferometer 16 is radiated on the -Y side reflective surface, and the length-measuring beam of the interferometer 18B is radiated on the -X side reflective surface of the fine stage WFS1. The interferometers 18A, 18B each have multiple length-measurement axes. In addition to performing measurements of position in the X-axis direction of the wafer stages WST1, WST2, these interferometers also perform measurements of "roll" (rotation about the Y-axis ($\theta_y$ rotation)) and "yaw" (rotation in the $\theta_z$ direction). Also, the interferometer 16 is a multi-axis interferometer. In addition to performing measurements of position in the Y-axis direction of the wafer stages WST1, WST2, the interferometer 16 also performs measurements of "pitch" (rotation about the X-axis ($\theta_x$ rotation)) and yaw (rotation in the $\theta_z$ direction).

Using the controller (not shown), the position, in the X-Y plane, of the fine stage WFS1 (or WFS2) is controlled with high accuracy, based on the measurement data produced by the interferometers 18A, 16 during exposure, as discussed below. Also, the position, in the X-Y plane, of the fine stage WFS2 (or WFS1) is controlled with high accuracy using the measurement data produced by the interferometer 18B and the head 90y (for performing measurements, in the Y-axis direction) of the head unit 90, during alignment (and during wafer-exchange), as discussed below.

In this embodiment, if a planar motor is not being used for driving the rough stages WRS1, WRS2 (e.g., during base BS transport, exposure-apparatus assembly, maintenance, or the like), a plate 36 can be used for preventing magnetic-flux leaks. As shown in FIG. 5, the plate 36 can be placed so as to cover the upper surface of the base BS. The plate 36 is made of a non-magnetic material and serves to prevent the magnetic flux generated by the magnet unit 30 from influencing the exterior of the system. As shown in FIG. 5, the plate 36 is sufficiently thick to cover the magnetic circuit formed by the magnet unit 30. Using the plate 36, as situation can be avoided in which a tool or the like used by an operator is abruptly attracted to the magnet unit 30 when the planar motor is not being used. The plate 36 also avoids the influence of magnetic flux on nearby medical equipment such as pacemakers or the like, and avoids the influence of magnetic flux on other apparatus used nearby when the base is being transported.

A series of operations, including parallel-processing operations for making exposures on a wafer on one wafer stage, aligning a wafer on the other wafer stage, and the like, as performed by the exposure apparatus 10 of this embodiment, is described with reference to FIGS. 2 and 12(A) to 13(B). FIG. 2 shows a condition in which the exposure operation for the wafer W1 on the wafer stage WST1 is performed in parallel with the wafer-alignment operation for the wafer W2 on the wafer stage WST2. In advance of the condition shown in FIG. 2, when the wafer stage WST2 is at a predetermined loading position, a previously exposed wafer on the wafer stage WST2 is unloaded from the wafer stage WST2, and a new wafer W2 is loaded on the wafer stage WST2 (this is termed wafer-exchange), by a wafer loader (not shown) in preparation for exposure.

The controller (not shown) governs the X-position of the wafer stage WST2, based on measurement data obtained by the interferometer 18B. The controller also meanwhile governs the Y-position of the wafer stage WST2, based on measurement data obtained by a head situated opposite either the scale 190 or the scale 290. This head is one of a plurality of heads 90y, used for measuring Y-axis position, situated on the wafer stage WST2. Further meanwhile, the controller obtains position data concerning an alignment mark (sample mark) applied to specific shot regions on the wafer W2, using the alignment system ALG.

Based on these position-detection results and the position coordinates of the specific shot-region layout, the controller executes EGA (enhanced global alignment) to find the respective array coordinates of all the shot regions on the wafer W2. This is performed using a statistical calculation using a method of least squares, as disclosed for example in Japan Published Patent Application No. Sho 61-44429. Before performing the EGA, the controller also can perform baseline measurements using the field-image meter FM2. The measurement data obtained by the field-image meter FM2 are transmitted wirelessly to the receiver 188 or 288 on the power-transmitting, waste-heat frame 24A or 24B from the transmitter on the power-receiving, heat-dissipating arm 20B.

During these wafer-exchange and alignment operations, the controller drives the rough stage WRS2 with a long stroke using the planar motor discussed above. The controller also drives the fine stage WFS2 using the fine-movement mechanism and empty-weight-canceling mechanism 22B1-22B3, based on detection data obtained by the interferometer 18B and heads 90y (scale 190 or 290).

In parallel with this wafer-exchange and alignment, a step-and-scan exposure operation is performed on the wafer-stage WST1 side. This exposure operation repeats an inter-shot stepping operation for moving the wafer stage WST1 to an initial acceleration position for the exposure of each shot region on the wafer W1 on the wafer stage WST1. The stepping operation is based on the results of wafer alignment already performed. Also, a scanning-exposure operation is performed, involving relative scanning in the Y-axis direction of the reticle R (reticle stage RST) and the wafer W1 (wafer stage WST1). The reticle pattern is transferred by the projection-optical system PO to the shot region on the wafer W1.

During this step-and-scan exposure operation, the controller drives the rough stage WRS1 with a long stroke using the planar motor discussed above, and drives the fine stage WFS1 using the fine-movement mechanism 140 and empty-weight-canceling mechanisms 22A1-22A3 in the X, Y, Z, $\theta_x$, $\theta_y$, and $\theta_z$ directions relative to the rough stage WRS1. The measurement data obtained by the wafer-focus sensor, discussed above, are considered when driving in the Z, $\theta_x$, and $\theta_y$ directions.

The procedures for the exposure operation itself are the same as in a conventional scanning stepper. Hence, further detailed description of exposure is omitted herein.

For aligning the wafer W2 on the wafer stage WST2 and exposing the wafer W1 on the wafer stage WST1, the wafer-alignment operation normally finishes first. After completing wafer alignment, the controller drives the wafer stage WST2, using the planar motor, in the −Y direction and −X direction. The wafer stage WST2 is then moved to a predetermined stand-by position (see position of the wafer stage WST2 in FIG. 12(A)), retained at that position.

When exposure of the wafer W1 on the wafer stage WST1 is completed, the controller moves the wafer stage WST1 in the +X direction and +Y direction, using the planar motor. FIG. 12(B) shows the situation just before the length-measuring beams from the interferometers 18A, 16 stop being incident on the −X-side reflective surface and the −Y-side reflective surface, respectively, of the wafer stage WST1. In this situation, certain of the heads 90x and certain of the heads 90y are situated opposite the scale 290. Hence, the controller switches the position measurement of the wafer stage WST1 from the interferometers 18A, 16 to the heads 90x, 90y. When the length-measuring beam from the interferometer 16 ceases striking the −Y-side reflective surface of the wafer stage WST1, the length-measuring beam from the interferometer 16 begins striking the −Y-side reflective surface of the wafer stage WST2. Hence, the controller switches the measurement of the Y-axis position of the wafer stage WST2 to the interferometer 16.

Next, as shown in FIG. 13(A), the controller causes the wafer stage WST2 to move directly beneath the projection-optical system PO, using the planar motor. Positioning of the wafer stage WST2 is based on the measurement data, relating to the Y-axis direction, from the interferometer 16 and on the measurement data, relating to the X-axis direction, from the heads 90x. During this movement, the length-measuring beam from the interferometer 18A strikes the −X-side reflective surface of the fine stage WFS2. Hence, measurements of the position, in the X-axis direction, of the wafer stage WST2 are switched from the heads 90x to the interferometer 18A.

Meanwhile, as noted, with the wafer stage WST1 at the position shown in FIG. 12(B), measurements of position of the wafer stage WST1 have switched from the interferometers 18A, 16 to the heads 90x, for measurements in the X-axis direction, and to the heads 90y, for measurements in the Y-axis direction. Thus, the position in the X-axis direction of the wafer stage WST1 is measured using the heads 90x and the scale 290, while the position in the Y-axis direction of the wafer stage WST1 is measured using the heads 90y and the scale 290. The wafer stage WST1 is caused to move in the +Y direction.

Then, as shown in FIG. 13(A), at the moment in which the length-measuring beam of the interferometer 18B irradiates the −X-side reflective surface of the fine stage WFS1, measurements relating to the Y-axis direction switches to the interferometer 18B. The wafer stage WST1 is moved to the position (wafer-exchange position) shown in FIG. 13(B).

Then, with respect to the wafer stage WST2, a step-and-scan exposure operation is performed on the wafer W2, similar to the exposure operation performed on the wafer W1. Meanwhile, with respect to the wafer stage WST1, wafer-exchange and wafer-alignment operations are executed as discussed above.

Thus, using the exposure apparatus 10 of this embodiment, the wafer stages WST1, WST2 are exchanged while exposure of a wafer on one wafer stage, and exchange and alignment of a wafer on the other wafer stage, are performed by simultaneous parallel processing.

In this embodiment, during parallel processing, the upper surface of the power-receiving, heat-dissipating arm 20A of the wafer stage WST1 and the lower surface of at least one power-transmitting, waste-heat frames 24A, 24B are maintained in opposition. Hence, the supply of electric power to the wafer stage WST1, the transfer of heat from the wafer stage WST1, and signal transmission and reception are possible in the portions that are in opposition. Similarly, with respect to the wafer stage WST2, the upper surface of the power-receiving, heat-dissipating arm 20B and the lower surface of at least one power-transmitting, waste-heat frames 24A, 24B are in opposition. Hence, the supply of electric power to the wafer stage WST2, the transfer of heat from the wafer stage WST2, and signal transmission and reception are possible in the portions that are in opposition.

In this embodiment, the power-transmitting, waste-heat frames 24A, 24B continually absorb heat radiated from the heat-dissipating unit 86E of the wafer stage WST1 (WST2). Hence, adverse influences of heat generated in the wafer stage WST1 (WST2) on exposure accuracy are suppressed. Also, since it is unnecessary to connect a coolant conduit to the wafer stage WST1 (WST2) for supplying coolant from the outside, declines in movement accuracy of the wafer stage WST1 (WST2) that would otherwise occur from conduit tension are eliminated, thereby allowing high exposure accuracy.

This embodiment includes an electric-power-input system 84 by which electric power is input wirelessly to the wafer stages WST1, WST2. Transmitters 184, 284 for outputting electric power wirelessly to the receiver 84A of the electric-power-input system are situated on the power-transmitting, waste-heat frames 24A, 24B. Hence, conventional wiring to supply electric current from externally to the driving mechanisms of the wafer stages WST1, WST2 is eliminated, which removes adverse effects in movement accuracy of the wafer stages that otherwise would be caused by tension of such wiring. Again, improved exposure accuracy is facilitated by this embodiment.

The transmitters 88D for wireless transmission of the signals output from the meters on the stages (e.g., field-image meters FM1, FM2) are provided on the wafer stages WST1, WST2. Receivers 188, 288 for receiving signals from the transmitters 88D are provided on the power-transmitting, waste-heat frames 24A, 24B. Hence, wiring conventionally used for taking up the signals output from the detectors need not be connected to the wafer stages WST1, WST2 from outside. This eliminates declines in movement accuracy of the stages, that otherwise would occur, due to tension of the wiring. Again, improved exposure accuracy is provided with this embodiment.

This embodiment utilizes two wafer stages with which high accuracy alignment is possible. Since the two wafer stages WST1, WST2 move between a position directly below the projection-optical system PO (exposure position) and a position directly below the alignment system ALG (alignment position), the wafer-exposure operation and the wafer-alignment operation can be performed in parallel, which facilitates performance of high accuracy exposures at high throughput.

Each wafer stage WST1 (WST2) comprises a respective rough stage WRS1 (WRS2) and a respective fine stage WFS1 (WFS2). Since the coils for all the voice-coil motors of the planar motors, of the fine-movement mechanism 140, and of the empty-weight-canceling mechanisms 22A1-22A3 (22B1-22B3) are situated on the rough stage WRS1 (WRS2), the conventional need to include wiring to supply electric current to the fine stage WFS1 (WFS2) is eliminated. Thus, more accurate wafer alignments are achieved because wiring is not connected from the rough stage to the fine stage requiring high alignment accuracy. Also, because the coolant supply may be established only on the rough-stage side due to the coils being established only on the rough-stage side, it is unnecessary to establish a coolant-supply conduit between the rough stage and the fine stage. Again, high-accuracy wafer alignment is achieved.

Each of the voice-coil motors of the fine-movement mechanism 140 generates driving force in a direction 45° to the X-axis and the Y-axis, and the fine stages WFS1, WFS2 are driven in the X-axis and Y-axis directions by the resultants of these driving forces. Consequently, the electric current consumed by one voice-coil motor can be suppressed, compared to a conventional case of simply using a respective voice-coil motor to generate driving force in the X-axis direction and a respective voice-coil motor to generate driving force in the Y-axis direction. As a result of this reduction of heat generation by the motors, conventional declines in exposure accuracy caused by heat generation are suppressed.

As a result of the protective plate 26 being situated on the base BS, when the supply of electric current to the coils of the armature unit 130 of the planar motor is stopped, damage to the permanent magnets on the base BS (in instances in which the wafer stage falls onto the base BS) can be prevented.

In this embodiment, the heads 90x, 90y and scales 190, 290 are provided, and positional measurements of the wafer stages WST1, WST2 are performed at a point where the length-measuring beam from the respective interferometer does not strike. Hence, even when the wafer stages WST1, WST2 move between a position directly below the projection-optical system PO and a position directly below the alignment system ALG, the interferometer disposition as in FIG. 2 is sufficient. This allows a reduction in the number of interferometers.

In the discussion above, a case was described in which heat generated by the wafer stage WST1 (WST2) is radiated into the heat-dissipating unit 86E established in the liquid-temperature-regulating system 86 (to which is connected the coolant conduit 202 for circulating coolant in the wafer stage WST1 (WST2)). But, this configuration is not intended to be limiting. The power-transmitting, waste-heat frames 24A, 24B may also absorb the heat radiated directly from the wafer stage WST1 (WST2), without having to provide the coolant conduit 202, heat dissipating unit 86E, and the like.

In this embodiment, plate-shaped members that are narrow in the X-axis direction are used as the power-transmitting, waste-heat frames 24A, 24B. However, this configuration is not intended to be limiting. These members can have increased width in the X-axis direction so long as there is no interference during exposure and alignment. In the described embodiment, the area of the heat-dissipating unit 86E is relatively small, and the power-transmitting, waste-heat frame can have approximately the same area as the upper surface of the base BS. Also, the power-transmitting, waste-heat frame is not limited to being situated above the wafer stage WST. Alternatively, this frame can be situated below the wafer stage WST, and the heat-dissipating unit 86E may also be situated on the lower-surface side of the wafer stage WST. Also, alternatively to the described embodiment, a lattice-shaped power-transmitting, waste-heat frame, configured to unify the two power-transmitting, waste-heat frames 24A, 24B in the described embodiment, may be employed.

The described embodiment concerned a case in which coolant is supplied to the waste-heat units 186, 286 of the power-transmitting, waste-heat frames 24A, 24B. However, this configuration is not intended to be limiting. For example, a cooling mechanism such as a Peltier element or the like may be provided on the waste-heat unit. Also, the waste-heat units 186, 286 of the power-transmitting, waste-heat frames 24A, 24B need not supply coolant if attention is focused only on absorbing heat radiated from the heat-dissipating unit.

The described embodiment concerned a case in which either of the power-transmitting, waste-heat frames 24A, 24B is continually in opposition to a waste-heat unit 186, 286. However, this configuration is not intended to be limiting. The power-transmitting, waste-heat frames may deviate somewhat from such opposition, if the heat radiated from the waste-heat units 186, 286 is absorbed by the power-transmitting, waste-heat frames 24A, 24B. Specifically, the described embodiment involved a case in which the power-transmitting, waste-heat frames 24A, 24B are established over the entire range of movement, in the Y-axis direction, of the wafer stage WST. But, this is not intended to be limiting. The power-transmitting, waste-heat frames 24A, 24B may alternatively be situated over a range smaller than the range of movement, in the Y-axis direction, of the wafer stage WST. In this latter case, without being limited to continuous absorption of radiated heat, there may be situations in which heat is not being absorbed for short periods of time, for example. Specifically, the power-transmitting, waste-heat frame 24A (24B) and the waste-heat unit 186 (286) can be opposed to each other in a range in which the wafer stage WST1 (WST2) moves at least during exposure of a wafer on the wafer stage WST1 (WST2), for example.

The described embodiment involved a case in which the power-transmitting, waste-heat frames 24A, 24B extend in the Y-axis direction and the power-receiving, heat-dissipating arms 20A, 20B extend in the X-axis direction. However, this configuration is not intended to be limiting. The power-transmitting, waste-heat frames 24A, 24B may alternatively extend in the X-axis direction while the power-receiving, heat-dissipating arms 20A, 20B extend in the Y-axis direction. Also, without being limited to the X- and Y-axis directions, one of the power-transmitting, waste-heat frames 24A, 24B and power-receiving, heat-dissipating arms 20A, 20B may extend in a predetermined direction in the X-Y plane, and the other may extend in a direction in the X-Y plane intersecting with the predetermined direction.

The described embodiment involved a case in which the armature unit of the planar motor is situated on the wafer-stage side. However, this configuration is not intended to be limiting. The armature unit alternatively may be situated on the base BS side and the magnet unit may be situated on the wafer-stage side. The described embodiment also involved a case in which the coil side of all the voice-coil motors of the fine-movement mechanism 140 and empty-weight-canceling mechanisms 22A1-22A3 (22B1-22B3) is situated on the rough-stage WRS1 (WRS2) side. However, this configuration is not intended to be limiting. The coils alternatively may be situated on the fine-stage side, especially if there is no adverse influence of such a configuration on the movement of the fine stage, even when wiring extends between the rough stage and fine stage.

The described embodiment involved a case in which the following are performed between the power-transmitting, waste-heat frames 24A, 24B and the power-receiving, heat-dissipating arms 20a, 20B: wireless transmission of electric power, transfer of heat, transmission and reception of detection signals from detectors, and position measurement when a length-measuring beam is not radiated from the interferometer. However, this configuration is not intended to be limiting. At least only one of the above may be performed.

The described embodiment involved a case in which a thick plate, as shown in FIG. 5, is used as a magnetic-flux-leak-prevention plate 36. However, this configuration is not intended to be limiting. A thin, plate-shaped plate may alternatively be employed for this purpose. This alternative plate may be placed above the base BS via a spacer element, so that the height of the upper surface thereof is the same as the height of the upper surface of the magnetic-flux-leak-prevention plate 36 shown in FIG. 5.

In the described embodiment, the interferometer system and encoder (head-unit 90 and scales 190, 290) are used in combination to perform position measurements of the wafer stages WST1, WST2. However, this configuration is not intended to be limiting. By changing the number of interferometers of the interferometer system, position measurements of the wafer stages WST1, WST2 may be performed using only the interferometer system; alternatively, the position measurements of the wafer stages WST1, WST2 can be performed using only the encoder.

The described embodiment involved a case in which, in the movable element 50 of the fine-movement apparatus 140, the direction in which the magnet units 52A, 52C are aligned and the direction in which the magnet units 52B, 52D are aligned are inclined 45° relative to the X-axis and Y-axis. However, this configuration is not intended to be limiting. The direction in which the magnet units 52A, 52C are aligned and the direction in which the magnet units 52B, 52D are aligned alternatively may be at any angle if the alternative directions intersect with the X-axis and Y-axis in the X-Y plane. The described embodiment also involved a case in which each of the voice-coil motors of the fine-movement apparatus 140 generates a driving force in a direction inclined 45° to the X-axis and Y-axis in the X-Y plane. However, this configuration is not intended to be limiting. The angle is immaterial so long as each driving force is generated in a direction that intersects the X-axis and Y-axis in the X-Y plane.

The described embodiment involved a case in which the protective plate 26, comprising a non-magnetic body, is configured to cover the magnet unit 30 from above on the upper surface of the base BS. However, this configuration is not intended to be limiting. Alternatively, a protective plate may be disposed on the lower surface of the wafer stages WST1, WST2. With this alternative protective plate, direct contact between the wafer stages WST1, WST2 and the permanent magnets 28N, 28S, 32 is prevented in the same manner as achieved by the protective plate 26 in the described embodiment. Thus, damage to the permanent magnets 28N, 28S, 32 is prevented.

The described embodiment involved a case of a wafer-stage apparatus comprising two wafer stages. However, this configuration is not intended to be limiting. The present invention encompasses wafer-stage apparatus comprising only one wafer stage, and encompasses wafer-stage apparatus comprising three or more wafer stages.

The described embodiment involved a case in which only one alignment system ALG is provided. However, this configuration is not intended to be limiting. Alternatively, two or more alignment systems ALG may be used, such as two corresponding to the wafer stages WST1, WST2, respectively.

Alternatively to using a wafer-focus sensor as in the described embodiment, a surface-form-detection device may be provided in the mounting holding the projection-optical system PO, for example. Such a surface-form-detection device would include a radiating system for radiating a line-shaped beam on the wafer. The device would include a light-receiving system comprising a detector for receiving the reflected light of the beam radiated by the radiating system. The detector can be a one-dimensional CCD sensor, line sensor, or the like. Thus, the Z-position (positional data relating to the Z-axis direction, perpendicular to a predetermined plane (X-Y plane) in which the wafer moves) of a wafer can be obtained at each measurement point, using a plurality of point-shaped radiating regions as measurement points. This is the same principle as detection performed using a known multipoint AF system. In this case, before starting actual exposure, when a wafer passes through the illumination region of the surface-form-detection apparatus, the distribution of the Z-position data of the wafer surface is calculated based on the measurement data (regarding wafer position) from the interferometer system or head unit 90 and the detection data from the detection apparatus. During exposure the position and attitude of the wafer stage, relative to the Z-axis can be controlled based on the calculation results.

In the described embodiment, a planar motor is used for driving the wafer stages WST1, WST2 with a long stroke. But, this is not intended to be limiting. A linear motor alternatively can be used.

The wafer stages WST1, WST2 in the described embodiment are not connected to wiring and conduits. Alternatively, wiring-conduit ports may be provided on a portion of the wafer stages WST1, WST2 so that electric power can be supplied directly to the wafer stages WST1, WST2 in the event of an emergency such as an accident or the like.

The described embodiment involved a case in which the fine-movement mechanism 140 and empty-weight-canceling mechanisms 22A1-22A3, 22B1-22B3 are provided on the wafer stages WST1, WST2. However, this is not intended to be limiting. Either mechanism can be provided on the wafer stage. In addition, a conventional voice-coil motor may be provided as the fine-movement mechanism and empty-weight-canceling mechanisms. The voice-coil motor can be either a moving-magnet-type voice-coil motor or a moving-coil-type voice-coil motor. A moving-magnet type is desirable from the standpoint of not having to connect pull-along wiring to the magnet.

The described embodiment involved a case in which the movable-body apparatus is utilized in a wafer-stage apparatus. However, this configuration is not intended to be limiting. It alternatively is possible to employ the movable-body apparatus in a reticle-stage apparatus. In addition, the described embodiment involved a case in which the subject movable-body apparatus is employed in a wafer stage for holding a wafer surface parallel with the horizontal plane (X-Y plane). This configuration is not intended to be limiting. The subject movable-body apparatus also can be employed in a vertical wafer stage for holding a wafer surface approximately parallel to a plane orthogonal to the X-Y plane, or in any other orientation.

The subject apparatus can be applied to an immersion exposure apparatus such as that disclosed in WO 2004/53955, incorporated herein by reference. Also, the exposure apparatus of the described embodiment alternatively may comprise a measurement stage that is separate from the wafer stage(s), as disclosed in WO 2005/074014 (incorporated herein by reference), for example. In this alternative case, the movable-body apparatus can be employed in a measurement stage MST, along with the wafer stage WST or instead of the wafer stage WST.

The described embodiment involved a case in which the subject movable-body apparatus was included in a scanning-type exposure apparatus such as the step-and-scan type, or the like. However, this is not intended to be limiting. Alternatively, the subject apparatus can be utilized in a step-and-repeat type of projection-exposure apparatus, in a step-and-stitch type of exposure apparatus, in a proximity-type exposure apparatus, a mirror-projection aligner, or the like.

The use of the subject exposure apparatus is not limited to exposure apparatus for semiconductor manufacturing. Alternatively, for example, the apparatus can be widely applied to exposure apparatus used for liquid crystal (e.g., transferring a liquid-crystal-display-element pattern to a glass plate), to exposure apparatus for manufacturing organic EL, thin-film magnetic heads, imaging elements (CCDs and the like), micromachines, DNA chips, and the like. The invention is also applicable to exposure apparatus for transferring circuit patterns to glass substrates, silicon wafers, or other suitable substrates, for manufacturing reticles or masks used in optical exposure apparatus, EUV exposure apparatus, X-ray exposure apparatus, electron-beam exposure apparatus, and the like, as well as microdevices such as semiconductor elements.

The described embodiment involved a case in which EUV light having a wavelength of 11 nm was used as the exposure light. However, this wavelength is not intended to be limiting. Alternative wavelengths include, but are not limited to, EUV light with a wavelength of 13 nm. To ensure an approximately 70% reflectance to the 13-nm wavelength EUV light, it is necessary to use a multilayer film comprising alternating layers of Mo and silicon (Si) as the reflective film on each mirror.

In the described embodiment, SOR (Synchrotron Orbital Radiation) was used as the source of exposure light. Alternatively, other sources may be used such as, but not limited to, laser-excited plasma light source, betatron light source, discharge light source, X-ray laser, and the like.

In the described embodiment, light having a wavelength of 100 nm or less was used as the exposure light. Alternatively, other wavelengths can be used, such as but not limited to: light having a wavelength of 100 nm or greater. Exemplary sources of such light are pulsed laser beams such as an ArF excimer laser beam (wavelength 193 nm), a KrF excimer laser beam (wavelength 248 nm), an $F_2$ excimer laser beam (wavelength 157 nm), an $Ar_2$ excimer laser beam (wavelength 126 nm), and a $Kr_2$ excimer laser beam (wavelength 146 nm); and continuous emission lines such as g-line (wavelength 436 nm), i-line (wavelength 365 nm), and the like (the latter produced by an extra-high-pressure mercury lamp). Also, the projection-optical system is not limited to one that produces reduced (demagnified) images. Alternatively, the projection-optical system can be either a magnifying or enlarging system. Furthermore, the projection-optical system is not limited to being a reflection-type projection-optical system comprising only reflecting optical elements. Alternatively (exposure-light wavelength permitting), the projection-optical system can be a reflecting-refracting (catadioptric system) projection-optical system comprising at least one reflective optical element and at least one refractive optical element, or a fully refractive projection-optical system comprising only refractive optical element(s).

The present invention also can be used in an exposure apparatus using a charged particle beam such as an electron beam, an ion beam, or the like, for exposures.

Various respective embodiments can utilize various types of masks or reticles, exposure-light wavelength permitting. As an alternative to the reflective reticle in the described embodiment, the reticle can be a light-transmitting reticle on which a predetermined light-blocking pattern (or phase-blocking pattern) is formed on a light-transmitting substrate. Further alternatively, the reticle can be an electronic mask forming a transmitting pattern, a reflective pattern, or a light-emitting pattern (or variable-shape mask, for example, a DMD (digital micro-mirror device) which is a type of non-light-emitting image-display element (also called a "spatial light modulator")) based on the electronic data of the pattern to be exposed, as disclosed in U.S. Pat. No. 6,778,257, for example, incorporated herein by reference. When using such a variable-shape mask, the relative positional control of the wafer and pattern image may be performed by varying the transmitting pattern or reflective pattern to be formed based on electronic data, with consideration of the detection results of the alignment mark discussed above, during the exposure of at least one separate shot region for which exposure is performed after a shot region which is exposed at the time of the alignment mark detection, from among the plurality of compartmentalized regions on the wafer.

Using an exposure apparatus as described herein, a semiconductor device can be manufactured by a process including a step in which device function and performance are designed; a step in which a reticle is produced based on the design step; a step in which a wafer or other substrate is manufactured from silicon or other material; a lithography step in which a pattern is transferred to the substrate (e.g., from a mask or reticle) and imprinted on a layer of photosensitive material on the substrate surface. This lithography step is performed using an exposure apparatus as described herein, wherein the transfer properties of the pattern are adjusted by performing adjustments as described in connection with the representative embodiment. The process also includes a device-assembly step (including dicing, bonding, and packaging), an inspection step, and the like. Since the exposure apparatus that is utilized in this process is as described herein, devices with high degrees of integration can be manufactured at high precision with good throughput.

The movable-body apparatus of the present invention can be used for achieving motion of a movable body in at least one axial direction in a horizontal plane or other suitable plane. Exposure apparatus and methods of the present invention are applicable to the exposure of an exposure body so as to imprint a pattern on the exposure body.

What is claimed is:
1. A movable-body apparatus, comprising:
a movable body;
heat-dissipating unit mounted to the movable body to remove heat from the movable body;
a driving device for driving the movable body in a predetermined plane defined by a first axis and a second axis intersecting the first axis; and
a waste-heat member disposed, without contacting the movable body, relative to the heat-dissipating unit and configured to absorb heat received by the heat-dissipating unit from the movable body;
wherein one of the waste-heat member and the heat-dissipating unit extends over a predetermined respective range relative to a respective one of the axes, and the other of the waste-heat member and heat-dissipating unit extends over a respective predetermined range relative to the respective other of the axes within the predetermined plane so that, as the movable body is moved within the plane, at least a portion of the heat-dissipating unit remains in heat-transfer confrontation with at least a portion of the waste-heat member.

2. The apparatus of claim 1, wherein:
the heat-dissipating unit extends in the direction of the respective axis and in a direction orthogonal to the respective axis;
the waste-heat member extends in the direction of the respective other axis and in a direction orthogonal thereto; and
multiple waste-heat members are disposed at a distance from each other relative to the respective other axis to maintain the heat-dissipating unit in confrontation with at least one waste-heat member at the movable body is moved within the plane.

3. The apparatus of claim 2, wherein the heat-dissipating unit is disposed on one surface of the movable body and extends substantially parallel to the predetermined plane.

4. The apparatus of claim 3, wherein the heat-dissipating unit discharges heat produced by cooling of the movable body.

5. The apparatus of claim 4, wherein:
the heat-dissipating unit comprises a circulation system for circulating a coolant and a temperature-regulating unit for regulating the temperature of the coolant; and
the waste-heat member is disposed continually in opposing relationship to at least a portion of the temperature-regulating unit, the waste-heat member being configured to absorb heat passing, across a gap defined between the heat-dissipating unit and the waste-heat member from the temperature-regulating unit.

6. The apparatus of claim 5, wherein:
the circulation system comprises a pump and a conduit configured to carry the coolant; and
the temperature-regulating unit comprises a cooling mechanism configured to absorb heat from the coolant and to radiate heat externally of the apparatus.

7. The apparatus of claim 1, wherein:
the waste-heat member comprises an electric-power-output unit configured to output electrical power in a wireless manner; and
the movable body comprises an electric-power-input unit configured to input electrical power output wirelessly from the electric-power-output unit.

8. The apparatus of claim 7, wherein the heat-dissipating mechanism is configured to utilize the electric power as it dissipates heat absorbed by the waste-heat member.

9. The apparatus of claim 7, configured to cool the movable body using the input electric power.

10. The apparatus of claim 7, wherein the driving device is configured to use electric power input by the electric-power-input unit to drive the movable body.

11. The apparatus of claim 1, wherein:
the movable body comprises a meter disposed thereon;
the movable body comprises a transmitter configured to transmit, in a wireless manner, a signal output from the meter; and
the waste-heat member comprises a receiver configured to receive a signal transmitted wirelessly from the transmitter.

12. The apparatus of claim 11, wherein the movable body comprises:
a rough stage movable at least in a direction corresponding to one of the axes in the predetermined plane; and
a fine stage mounted to the rough stage and configured to move finely relative to the rough stage.

13. The apparatus of claim 12, wherein:
the driving device comprises a moving-magnet-type fine-movement mechanism comprising a movable element including a plurality of magnets established on the fine stage, and a fixed element including a plurality of coils established on the rough stage; and
the fine stage is driven finely relative to the rough stage by the fine-movement mechanism.

14. The apparatus of claim 13, wherein:
the fine-movement mechanism further comprises a first fine-movement unit configured to generate a driving force in a first direction intersecting with respective directions of the first axis and the second axis in the predetermined plane, and a second fine-movement unit configured to generate a driving force in a second direction intersecting with the directions of the first axis and the second axis and the first direction in the predetermined plane; and
the fine stage is configured to be driven in at least one of the following directions by a resultant of the driving forces generated by the first and second fine-movement units: the direction of the first axis, the direction of the second axis, and a rotary direction in the predetermined plane.

15. The apparatus of claim 13, wherein:
the movable body is configured to be driven in a horizontal plane orthogonal to a gravitational-force direction; and
the driving device comprises an empty-weight-canceling mechanism situated and configured to cancel an empty weight of the fine stage, and a moving-magnet-type voice-coil motor situated and configured to impose a driving force, in the gravitational-force direction, on the fine stage.

16. The apparatus of claim 15, wherein the heat-dissipating unit of the movable body further comprises at least one portion situated in opposing relationship to the waste-heat member on the rough stage.

17. The apparatus of claim 1, further comprising a substantially horizontal base having a surface, wherein:
the movable body is disposed relative to the base;
the driving device further comprises a magnet unit disposed on the base and comprising a plurality of permanent magnets arrayed in a two-dimensional manner; and
the movable body comprises an armature unit that comprises a plurality of armature coils disposed in a two-dimensional manner in opposing relationship to the magnet unit;
wherein the movable body is driven by electromagnetic interaction between the magnet unit and the armature unit.

18. The apparatus of claim 17, wherein:
the magnet unit is arrayed so that polarities of adjacent magnet faces are mutually different;
the magnets comprise a plurality of thrust-generating magnets having rectilinear magnet faces, and a plurality of interpolation magnets arranged in a path of magnetic flux formed between adjacent thrust-generating magnets, the interpolation magnets being configured to intensify magnetomotive force.

19. The apparatus of claim 18, wherein the driving apparatus is configured to generate a magnetic-levitational force, in a gravitational-force direction, on the movable body by electromagnetic interaction between the magnet unit and the armature unit.

20. The apparatus of claim 19, wherein:
the movable body further comprises a magnetic-body member disposed on the movable body;
the magnetic-body member is configured to generate a magnetic attraction with the magnet unit and to maintain a predetermined gap between the movable body and the base by establishing a balance between a magnetically attractive force and the levitational force.

21. The apparatus of claim 20, further comprising a non-magnetic-body protective member situated and configured to eliminate contact between the magnet unit and the movable body.

22. The apparatus of claim 21, further comprising a cover member situated and configured to suppress or eliminate leakage of magnetic flux from the magnet unit when the movable body is not in use, the cover member being disposed on the surface of the base.

23. The apparatus of claim 1, further comprising an encoder disposed either on the waste-heat member or on the movable body and configured to detect a position of the movable body, the encoder comprising a head located on one of the waste-heat member and the movable body, and comprising a scale located on the other of the waste-heat member and the movable body, the head being configured to radiate a beam of light on the scale.

24. The apparatus of claim 23, further comprising an interferometer situated and configured to detect a position of the movable body and to produce positional data, wherein detection of the position of the movable body using the encoder is executed at least whenever detection of the position of the movable body using the interferometer cannot be performed.

25. The apparatus of claim 1, further comprising a temperature-regulating apparatus situated and configured to regulate a temperature of the waste-heat member.

26. The apparatus of claim 25, further comprising multiple movable bodies, wherein the waste-heat member is situated and configured to absorb heat radiated from each of the movable bodies.

27. The apparatus of claim 26, wherein the multiple movable bodies are configured to exchange positions mutually, relative to a predetermined direction.

28. The apparatus of claim 27, further comprising multiple waste-heat members situated lengthwise to the predetermined direction, and at intervals approximately less than or equal to a width of one of the movable bodies relative to a direction orthogonal to the predetermined direction in the predetermined plane.

29. The apparatus of claim 28, further comprising a measurement apparatus situated and configured to measure a position of at least one of the movable bodies being driven in a first region of the predetermined plane and to produce corresponding position data, wherein the position of the moving body is controlled using the position data, and radiated heat is absorbed by the waste-heat member as the movable body is being driven at least in the first region by the driving device.

30. The apparatus of claim 29, wherein:
the driving device is configured to drive at least one of the movable bodies disposed in a second region of the predetermined plane, the second region being different at least in part from the first region; and
the waste-heat member is configured to absorb heat radiated from the movable body as the movable body is being driven in the second region.

31. The apparatus of claim 30, wherein:
the multiple movable bodies comprise a second movable body; and
the second movable body situated in the second region is movable from the second region to the first region by exchange with the first movable body situated in the first region.

32. The apparatus of claim 31, further configured to execute different respective operations on exposure bodies mounted on respective movable bodies in the first and second regions, wherein the driving device is configured to drive each of the movable bodies in the first and second regions, respectively, so that at least respective parts of the different operations are performed in parallel.

33. The apparatus of claim 32, wherein:
each of the multiple movable bodies is driven two-dimensionally in the predetermined plane;
each of the multiple movable bodies comprises a respective heat-dissipating unit;
the heat-dissipating unit of each movable body extends in a direction of the first axis in the predetermined plane; and
the waste-heat member is disposed in an intersecting relationship with the direction of the first axis in the predetermined plane.

34. The apparatus of claim 33, further comprising multiple waste-heat members extending in the direction of the second axis, orthogonal to the direction of the first axis in the predetermined plane, and at a distance relative to the direction of the first axis, wherein each heat-dissipating unit extends over a predetermined range no less than the interval between the multiple waste-heat members, relative to the direction of the first axis.

35. The apparatus of claim 33, wherein multiple waste-heat members extend in the direction of the second axis, orthogonal to the direction of the first axis in the predetermined plane, at intervals no greater than a width of the heat-dissipating unit, relative to the direction of the first axis.

36. The apparatus of claim 1, wherein the movable body is situated in a vacuum or subatmospheric-pressure environment.

37. An exposure apparatus for exposing a pattern onto an exposure body, the exposure apparatus comprising a movable-body apparatus as recited in claim 29, wherein a first movable body of the movable-body apparatus holds a first exposure body at an exposure position in the predetermined plane during exposure of the first exposure body, and a second movable body of the movable-body apparatus holds a second exposure body to be exposed following exposure of the first exposure body, the movable-body apparatus being configured to exchange the first and second movable bodies at the exposure position following exposure of the first exposure body.

38. The exposure apparatus of claim 37, wherein:
the measurement apparatus comprises first and second measurement devices, the first measurement device being configured to perform a measurement of the first exposure body at a measurement position in the predetermined plane, and the second measurement device being configured to perform a measurement of the second exposure body on the second movable body at the measurement position in the predetermined plane, the measurement position being different from the exposure position in the predetermined plane, the measurement of the second exposure body being performed in parallel with at least a part of an exposure operation performed on the first exposure body on the first movable body at the exposure position; and
the movable-body apparatus is further configured to move the second movable body, with the second exposure body thereon, from the measurement position to the exposure position after completing exposure of the first exposure body.

39. The exposure apparatus of claim 38, wherein the measurement apparatus is situated and configured to obtain, in an independent manner, position data of the first movable body in a first region including the exposure position in the predetermined plane, and position data of the second movable body in a second region, of which at least part is different from the first region and including the measurement position in the predetermined plane.

40. The exposure apparatus of claim 39, wherein the waste-heat member is configured at least to absorb heat radiated from a movable body disposed at the exposure position.

41. The exposure apparatus of claim 40, wherein:
the waste-heat member is disposed on a surface on which the movable bodies are disposed;
the heat-dissipating unit includes a loading-surface side; and
the waste-heat member is configured to absorb heat from the heat-dissipating unit.

42. The exposure apparatus of claim 41, wherein the movable body is situated in a vacuum or subatmospheric-pressure environment.

43. An exposure apparatus for exposing a pattern onto an exposure body, the exposure apparatus comprising a movable-body apparatus as recited in claim 1, wherein exposure of the exposure body is performed while the exposure body is mounted on the movable body.

44. A movable-body apparatus, comprising:
a movable body;
an electric-power-input unit disposed on the movable body and configured to input electric power wirelessly to the movable body at any position of the movable body within a defined plane;
an electric-power-output unit disposed in a non-contacting manner with respect to the movable body, continually opposite at least part of the electric-power-input unit, the electric-power-output unit being configured to output electric power wirelessly to the electric-power-input unit and the electric-power-input unit receiving said electric power; and
a driving apparatus configured to use the electric power input to the electric-power-input unit for driving said movable body.

45. The apparatus of claim 44, further comprising a waste-heat member disposed in a non-contacting manner relative to the movable body so as to be continually situated opposite at least part of the movable body, the waste-heat member being configured to absorb heat radiated from the movable body.

46. The apparatus of claim 44, wherein the movable body is situated in a vacuum or low-pressure environment.

47. A movable-body apparatus, comprising:
a movable body movable at least in a defined range in a defined plane;
a meter disposed on the movable body to move with corresponding motions of the movable body in the defined range;
a transmitter disposed on the movable body and configured to transmit wirelessly a signal output from the meter as the body is moved in the defined range; and
a receiver disposed in a non-contacting manner relative to the movable body so as to be continually situated a defined distance opposite at least part of the transmitter regardless of position of the movable body in the defined range, the receiver being configured to receive a signal transmitted wirelessly from the transmitter.

48. The apparatus of claim 47, wherein the movable body is situated in a vacuum or low-pressure environment.

49. A movable-body apparatus, comprising:
a movable body;
a fine-movement member supported in a non-contacting manner relative to the movable body so as to move with corresponding motions of the movable body; and
a driving mechanism, comprising four armature coils situated on the movable body and respective magnet units situated on the fine-movement member opposite the respective armature coils, the magnet units being cooperatively operable with the four armature coils to generate a driving force for moving the fine-movement member relative to the movable body at least in a plane defined by orthogonal X and Y axes, wherein each magnet unit comprises multiple magnet portions, and the magnet units are arranged in two opposing pairs thereof along respective axes that are normal to each other in the plane but at respective 45° angles relative to the X and Y axes.

50. The apparatus of claim 49, wherein opposing magnet units forming a pair are of opposite polarity.

51. The apparatus of claim 49, wherein the driving mechanism is configured to move the fine-movement member relative to the movable body with at least one of a translational driving force in the plane or a rotary driving force in the plane, by supplying electric current selectively to the four armature coils.

52. The apparatus of claim 49, further comprising an empty-weight-canceling mechanism disposed on the movable body and supporting an empty weight of the fine-movement member.

53. The apparatus of claim 52, wherein the fine-movement member and the empty-weight-canceling mechanism do not contact each other.

54. The apparatus of claim 52, wherein the empty-weight-canceling mechanism is configured to impose respective forces on the fine-movement member to move in a direction perpendicular to the two-dimensional plane and to move in a direction at an inclination to the two-dimensional plane.

55. The apparatus of claim 49, wherein the fine-movement member is disposed vertically above the movable body.

56. The apparatus of claim 49, further comprising a planar motor situated and configured to drive the movable body.

* * * * *

UNITED STATES PATENT AND TRADEMARK OFFICE
CERTIFICATE OF CORRECTION

| | | |
|---|---|---|
| PATENT NO. | : 7,696,653 B2 | Page 1 of 1 |
| APPLICATION NO. | : 11/712243 | |
| DATED | : April 13, 2010 | |
| INVENTOR(S) | : Keiichi Tanaka | |

It is certified that error appears in the above-identified patent and that said Letters Patent is hereby corrected as shown below:

In the Specification:

Column 5, line 47, "has as projection" should be --has a projection--

Column 10, line 67, "than of" should be --than that of--

Column 11, line 63, "air-pad mechanism 72" should be --air-pad mechanism 74--

Column 14, line 7, "receiver 88D" should be --receiver 188--

Column 15, line 63, "as situation" should be --a situation--

Column 20, line 67, "arms 20a" should be --arms 20A--

In the Claims:

Column 25, lines 11-12, "at the movable body is moved within the plane" should be --as the movable body is moved within the plane--

Signed and Sealed this
Thirty-first Day of May, 2011

David J. Kappos
*Director of the United States Patent and Trademark Office*